(12) United States Patent
de Rochemont

(10) Patent No.: US 9,123,768 B2
(45) Date of Patent: Sep. 1, 2015

(54) SEMICONDUCTOR CHIP CARRIERS WITH MONOLITHICALLY INTEGRATED QUANTUM DOT DEVICES AND METHOD OF MANUFACTURE THEREOF

(76) Inventor: L. Pierre de Rochemont, Austin, TX (US)

( * ) Notice: Subject to any disclaimer, the term of this patent is extended or adjusted under 35 U.S.C. 154(b) by 272 days.

(21) Appl. No.: 13/288,922

(22) Filed: Nov. 3, 2011

(65) Prior Publication Data
US 2012/0104358 A1    May 3, 2012

Related U.S. Application Data

(60) Provisional application No. 61/409,846, filed on Nov. 3, 2010.

(51) Int. Cl.
| | | |
|---|---|---|
| *H01L 29/06* | (2006.01) | |
| *H01L 29/78* | (2006.01) | |
| *H01L 21/06* | (2006.01) | |
| *H01L 29/739* | (2006.01) | |
| *B82Y 10/00* | (2011.01) | |

(Continued)

(52) U.S. Cl.
CPC ............. *H01L 29/7395* (2013.01); *B82Y 10/00* (2013.01); *B82Y 40/00* (2013.01); *H01L 29/04* (2013.01); *H01L 29/127* (2013.01); *H01L 29/151* (2013.01); *H01L 29/78* (2013.01); *H01L 21/02521* (2013.01); *H01L 21/02532* (2013.01); *H01L 21/02535* (2013.01); *H01L 21/02628* (2013.01); *H01L 33/18* (2013.01)

(58) Field of Classification Search
CPC ..... H01L 29/04; H01L 29/152; H01L 29/127; H01L 29/151; H01L 29/201; H01L 29/7395; H01L 29/78; H01L 29/8613; H01L 29/775; H01L 29/778; H01L 21/02521; H01L 21/02532; H01L 21/02535; H01L 21/02628; H01L 21/02389; H01L 21/02458; H01L 21/0251; H01L 21/0254; H01L 21/02579; H01L 21/02631; H01L 21/02433; H01L 33/18; B82Y 10/00; B82Y 30/00; B82Y 20/00; B82Y 5/00; Y02E 10/50
USPC ............. 977/774; 257/14, E29.072, E21.115; 438/502
See application file for complete search history.

(56) References Cited

U.S. PATENT DOCUMENTS

| | | | |
|---|---|---|---|
| 2,283,925 | A | 5/1942 | Harvey |
| 2,886,529 | A | 5/1959 | Louis |

(Continued)

FOREIGN PATENT DOCUMENTS

| | | |
|---|---|---|
| CN | 1450580 A | 10/2003 |
| EP | 0026056 A1 | 4/1981 |

(Continued)

OTHER PUBLICATIONS

13288922_20130920_CN 11450580 A.*

(Continued)

*Primary Examiner* — Chuong A Luu
*Assistant Examiner* — Moazzam Hossain
(74) *Attorney, Agent, or Firm* — Burns & Levinson LLP; David W. Gomes

(57) ABSTRACT

A three-dimensional polycrystalline semiconductor material provides a major ingredient forming individual crystalline grains having a nominal maximum grain diameter less than or equal to 50 nm, and a minor ingredient forming boundaries between the individual crystalline grains.

16 Claims, 17 Drawing Sheets

(51) Int. Cl.
  *B82Y 40/00* (2011.01)
  *H01L 29/12* (2006.01)
  *H01L 29/15* (2006.01)
  *H01L 29/04* (2006.01)
  *H01L 21/02* (2006.01)
  *H01L 33/18* (2010.01)

(56) References Cited

U.S. PATENT DOCUMENTS

| | | | |
|---|---|---|---|
| 3,574,114 A | 4/1971 | Monforte | |
| 3,614,554 A | 10/1971 | Shield et al. | |
| 3,983,077 A | 9/1976 | Fuller et al. | |
| 4,400,683 A | 8/1983 | Eda et al. | |
| 4,455,545 A | 6/1984 | Shelly | |
| 4,523,170 A | 6/1985 | Huth, III | |
| 4,646,038 A | 2/1987 | Wanat | |
| 4,759,120 A | 7/1988 | Bernstein | |
| 4,859,492 A | 8/1989 | Rogers, Jr. et al. | |
| 4,880,770 A | 11/1989 | Mir et al. | |
| 4,967,201 A | 10/1990 | Rich, III | |
| 5,084,749 A | 1/1992 | Losee et al. | |
| 5,130,675 A | 7/1992 | Sugawara | |
| 5,139,999 A | 8/1992 | Gordan et al. | |
| 5,154,973 A | 10/1992 | Imagawa et al. | |
| 5,198,824 A | 3/1993 | Poradish | |
| 5,217,754 A | 6/1993 | Santiago-Aviles et al. | |
| 5,219,377 A | 6/1993 | Poradish | |
| 5,263,198 A | 11/1993 | Geddes et al. | |
| 5,272,485 A | 12/1993 | Mason et al. | |
| 5,403,797 A | 4/1995 | Ohtani et al. | |
| 5,427,988 A | 6/1995 | Sengupta et al. | |
| 5,456,945 A | 10/1995 | McMillan et al. | |
| 5,478,610 A | 12/1995 | Desu et al. | |
| 5,513,382 A | 4/1996 | Agahi-Kesheh et al. | |
| 5,535,445 A | 7/1996 | Gunton | |
| 5,540,772 A | 7/1996 | McMillan et al. | |
| 5,543,773 A | 8/1996 | Evans et al. | |
| 5,584,053 A | 12/1996 | Kommrusch et al. | |
| 5,590,387 A | 12/1996 | Schmidt et al. | |
| 5,614,252 A | 3/1997 | McMillan et al. | |
| 5,625,365 A | 4/1997 | Tom et al. | |
| 5,635,433 A | 6/1997 | Sengupta | |
| 5,707,459 A | 1/1998 | Itoyama et al. | |
| 5,707,715 A | 1/1998 | deRochemont et al. | |
| 5,747,870 A | 5/1998 | Pedder | |
| 5,759,923 A | 6/1998 | McMillan et al. | |
| 5,764,189 A | 6/1998 | Lohninger | |
| 5,771,567 A | 6/1998 | Pierce et al. | |
| 5,854,608 A | 12/1998 | Leisten | |
| 5,859,621 A | 1/1999 | Leisten | |
| 5,888,583 A | 3/1999 | McMillan et al. | |
| 5,889,459 A | 3/1999 | Hattori et al. | |
| 5,892,489 A | 4/1999 | Kanba et al. | |
| 5,903,421 A | 5/1999 | Furutani et al. | |
| 5,933,121 A | 8/1999 | Rainhart et al. | |
| 5,945,963 A | 8/1999 | Leisten | |
| 6,023,251 A | 2/2000 | Koo et al. | |
| 6,027,826 A | 2/2000 | deRochemont | |
| 6,028,568 A | 2/2000 | Asakura et al. | |
| 6,031,445 A | 2/2000 | Marty et al. | |
| 6,040,805 A | 3/2000 | Huynh et al. | |
| 6,046,707 A | 4/2000 | Gaughan et al. | |
| 6,052,040 A | 4/2000 | Hino | |
| 6,111,544 A | 8/2000 | Dakeya et al. | |
| 6,130,471 A * | 10/2000 | Boles | 257/577 |
| 6,143,432 A | 11/2000 | deRochemont et al. | |
| 6,154,176 A | 11/2000 | Fathy et al. | |
| 6,176,004 B1 | 1/2001 | Rainhart et al. | |
| 6,181,297 B1 | 1/2001 | Leisten | |
| 6,188,368 B1 | 2/2001 | Koriyama et al. | |
| 6,195,049 B1 | 2/2001 | Kim et al. | |
| 6,204,203 B1 | 3/2001 | Narwankar et al. | |
| 6,208,843 B1 | 3/2001 | Huang et al. | |
| 6,222,489 B1 | 4/2001 | Tsuru et al. | |
| 6,266,020 B1 | 7/2001 | Chang | |
| 6,271,803 B1 | 8/2001 | Watanabe et al. | |
| 6,300,894 B1 | 10/2001 | Lynch et al. | |
| 6,320,547 B1 | 11/2001 | Fathy et al. | |
| 6,323,549 B1 | 11/2001 | deRochemont et al. | |
| 6,492,949 B1 | 12/2002 | Breglia et al. | |
| 6,496,149 B1 | 12/2002 | Birnbaum et al. | |
| 6,501,415 B1 | 12/2002 | Viana et al. | |
| 6,541,820 B1 | 4/2003 | Bol | |
| 6,552,693 B1 | 4/2003 | Leisten | |
| 6,559,735 B1 | 5/2003 | Hoang et al. | |
| 6,583,699 B2 | 6/2003 | Yokoyama | |
| 6,605,151 B1 | 8/2003 | Wessels et al. | |
| 6,611,419 B1 | 8/2003 | Chakravorty | |
| 6,620,750 B2 | 9/2003 | Kim et al. | |
| 6,639,556 B2 | 10/2003 | Baba | |
| 6,642,908 B2 | 11/2003 | Pleva et al. | |
| 6,650,303 B2 | 11/2003 | Kim et al. | |
| 6,670,497 B2 | 12/2003 | Tashino et al. | |
| 6,680,700 B2 | 1/2004 | Hilgers | |
| 6,683,576 B2 | 1/2004 | Achim | |
| 6,686,406 B2 | 2/2004 | Tomomatsu et al. | |
| 6,690,336 B1 | 2/2004 | Leisten et al. | |
| 6,697,605 B1 | 2/2004 | Atokawa et al. | |
| 6,742,249 B2 | 6/2004 | deRochemont et al. | |
| 6,743,744 B1 | 6/2004 | Kim et al. | |
| 6,762,237 B2 | 7/2004 | Glatkowski et al. | |
| 6,791,496 B1 | 9/2004 | Killen et al. | |
| 6,864,848 B2 | 3/2005 | Sievenpiper | |
| 6,906,674 B2 | 6/2005 | McKinzie, III et al. | |
| 6,919,119 B2 | 7/2005 | Kalkan et al. | |
| 6,940,087 B2 | 9/2005 | Komoda et al. | |
| 7,047,637 B2 | 5/2006 | deRochemont et al. | |
| 7,405,698 B2 | 7/2008 | deRochemont | |
| 7,564,887 B2 | 7/2009 | Wang et al. | |
| 7,763,917 B2 | 7/2010 | deRochemont | |
| 2001/0023779 A1 | 9/2001 | Sugaya et al. | |
| 2001/0027119 A1 | 10/2001 | Furutani et al. | |
| 2001/0048969 A1 | 12/2001 | Constantino et al. | |
| 2002/0039667 A1 | 4/2002 | Takaya et al. | |
| 2002/0047768 A1 | 4/2002 | Duffy | |
| 2002/0070983 A1 | 6/2002 | Kozub et al. | |
| 2002/0092472 A1 | 7/2002 | Hayashi et al. | |
| 2002/0110004 A1 | 8/2002 | Parks | |
| 2002/0190818 A1 | 12/2002 | Endou et al. | |
| 2003/0002045 A1 | 1/2003 | Nemat-Nasser et al. | |
| 2003/0034124 A1 | 2/2003 | Sugaya et al. | |
| 2003/0073565 A1 | 4/2003 | Ellis et al. | |
| 2003/0080325 A1 | 5/2003 | Uchiyama et al. | |
| 2003/0107455 A1 | 6/2003 | Imanaka et al. | |
| 2003/0111714 A1 | 6/2003 | Bates et al. | |
| 2003/0122647 A1 | 7/2003 | Ou | |
| 2003/0148024 A1 | 8/2003 | Kodas et al. | |
| 2003/0161959 A1 | 8/2003 | Kodas et al. | |
| 2003/0170436 A1 | 9/2003 | Sumi et al. | |
| 2003/0221621 A1 | 12/2003 | Pokharna et al. | |
| 2004/0000964 A1 | 1/2004 | Killen et al. | |
| 2004/0000966 A1 | 1/2004 | Killen et al. | |
| 2004/0000970 A1 | 1/2004 | Killen et al. | |
| 2004/0000972 A1 | 1/2004 | Killen et al. | |
| 2004/0000975 A1 | 1/2004 | Killen et al. | |
| 2004/0000976 A1 | 1/2004 | Killen et al. | |
| 2004/0001024 A1 | 1/2004 | Killen et al. | |
| 2004/0001026 A1 | 1/2004 | Killen et al. | |
| 2004/0001027 A1 | 1/2004 | Killen et al. | |
| 2004/0001028 A1 | 1/2004 | Killen et al. | |
| 2004/0012081 A1 | 1/2004 | Kwon | |
| 2004/0033654 A1 | 2/2004 | Yamagata | |
| 2004/0070334 A1 * | 4/2004 | Buckley et al. | 313/504 |
| 2004/0070915 A1 | 4/2004 | Nagai et al. | |
| 2004/0084080 A1 | 5/2004 | Sager et al. | |
| 2004/0092236 A1 | 5/2004 | Irie et al. | |
| 2004/0113738 A1 | 6/2004 | Ahn et al. | |
| 2004/0118448 A1 | 6/2004 | Scher et al. | |
| 2004/0145874 A1 * | 7/2004 | Pinel et al. | 361/748 |
| 2004/0189528 A1 | 9/2004 | Killen et al. | |
| 2004/0195575 A1 * | 10/2004 | Komoda et al. | 257/77 |
| 2005/0036269 A1 | 2/2005 | Ma et al. | |
| 2005/0051870 A1 | 3/2005 | Yamazaki et al. | |

(56) References Cited

U.S. PATENT DOCUMENTS

| | | | |
|---|---|---|---|
| 2005/0127389 A1* | 6/2005 | Fujiwara et al. | 257/99 |
| 2006/0086994 A1 | 4/2006 | Viefers et al. | |
| 2006/0092079 A1 | 5/2006 | deRochemont | |
| 2006/0125681 A1 | 6/2006 | Smith et al. | |
| 2006/0134491 A1 | 6/2006 | Hilchenko et al. | |
| 2006/0189104 A1* | 8/2006 | Yan | 438/478 |
| 2007/0003781 A1 | 1/2007 | deRochemont | |
| 2007/0137257 A1 | 6/2007 | Desantolo et al. | |
| 2007/0139976 A1 | 6/2007 | deRochemont | |
| 2007/0166453 A1 | 7/2007 | Van Duren et al. | |
| 2007/0170535 A1 | 7/2007 | deRochemont | |
| 2007/0181906 A1 | 8/2007 | Chik et al. | |
| 2007/0259768 A1 | 11/2007 | Kear et al. | |
| 2008/0136395 A1 | 6/2008 | Bennett | |
| 2009/0004370 A1 | 1/2009 | Zurcher et al. | |
| 2009/0011922 A1 | 1/2009 | deRochemont | |
| 2009/0015314 A1 | 1/2009 | Kirchmeier et al. | |
| 2010/0108986 A1 | 5/2010 | Fuertes Maron et al. | |
| 2010/0155786 A1* | 6/2010 | Heald et al. | 257/213 |
| 2011/0021007 A1 | 1/2011 | deRochemont | |
| 2011/0049394 A1 | 3/2011 | deRochemont | |
| 2011/0065224 A1 | 3/2011 | Bollman et al. | |
| 2011/0248900 A1 | 10/2011 | deRochemont | |

FOREIGN PATENT DOCUMENTS

| | | |
|---|---|---|
| EP | 0939451 A1 | 1/1999 |
| EP | 1376759 A2 | 2/2004 |
| GB | 1125897 A | 9/1968 |

OTHER PUBLICATIONS

International Search Report and Written Opinion dated Feb. 21, 2012 for PCT/US11/059236.

Andrenko, A.S. et al. EM Analysis of PBG Substrate Microstrip Circuits for Integrated Transmitter Front End. MMET 2000 Proceedings pp. 295-297.

Bardi, I. et al. Plane Wave Scattering From Frequency-Selective Surfaces by the Finite-Element Method. IEEE Transactions on Magnetics 38(2) Mar. 2002. pp. 641-644.

Chappell, W. et al. Composite Metamaterial Systems for Two-Dimensional Periodic Structures. © 2002 IEEE pp. 384-387.

Cheng, Y.L. et al. Preparation and Characterization of (Ba.Sr)TiO3 thin films using interdigital electrodes. Microelectronic Engineering vol. 66 (2003) 872-879.

Clavijo, S. et al. Design Methodology for Sievenpiper High-Impedance Surfaces: An Artificial Magnetic Conductor for Positive Gain Electrically Small Antennas. IEEE Transactions on Antennas and Propagation 51(10). Oct. 2003. pp. 2678-2690.

Diaz, R. et al. Magnetic Loading of Artificial Magnetic Conductors for Bandwidth Enhancement. © 2003 IEEE pp. 431-434.

Hansen, R.C. Effects of a High-Impedance Screen on a Dipole Antenna. IEEE Antennas and Wireless Propagation Letters vol. 1 2002 pp. 46-49.

Joshi, P.C. et al. Processing and Characterization of Pure and Doped Ba0.6Sr0.4TiO3 thin films for tunable microwave applications. Mat. Res. Soc. Symp. Proc. vol. 656E (2001) DD4.9.1-DD4.9.6.

Kern, D.J. et al. Active Negative Impedance Loaded EBG Structures for the Realization of Ultra-Wideband Artificial Magnetic Conductors. © 2003 IEEE pp. 427-430.

Kern, D.J. et al. The Synthesis of Metamaterial Ferrites for RF Applications Using Electromagnetic Bandgap Structures. © 2003 IEEE pp. 497-500.

Kern, D.J. et al. Ultra-thin Electromagnetic Bandgap Absorbers Synthesized via Genetic Algorithms. © 2003 IEEE pp. 1119-1122.

Khun, R. et al., Characterization of Novel Mono- and Bifacially Active Semi-Transparent Crystalline Silicon Solar Cells, IEEE Transactions on Electron Devices, 46(10), Oct. 1999. 2013-2017.

Kretly, L.C. et al. The Influence of the Height Variation on the Frequency Bandgap in an AMC Artificial Magnetic Conductor for Wireless Applications: an EM Experimental Design Approach. Proceedings SBMO/IEEE MTT-SIMOC 2003 pp. 219-223.

Lee, Y. et al. Investigation of Electromagnetic Bandgap (EBG) Structures for Antenna Pattern Control. © 2003 IEEE, pp. 1115-1118.

McKinzie III, W.E. et al. Mitigation of Multipath Through the Use of an Artificial Magnetic Conductor for Precision CPS Surveying Antennas. © 2002 IEEE pp. 640-643.

McKinzie, W. et al. A Multi-Band Artificial Magnetic Conductor Comprised of Multiple FSS Layers. © 2003 IEEE pp. 423-426.

Monorchio, A. et al. Synthesis of Artificial Magnetic Conductors by Using Multilayered Frequency Selective Surfaces. IEEE Antennas and Wireless Propagation Letters vol. 1 2002 pp. 196-199.

Mosallaei, H. et al. Periodic Bandgap and Effective Dielectric Materials in Electromagnetics: Characterization and Applications in Nanocavities and Waveguides. IEEE Transactions on Antennas and Propagation 51(3). Mar. 2003. pp. 549-563.

Pontes, F.M. et al. Study of the dielectric and ferroelectric properties of chemically processed BaxSr1-xTiO3 thin films. Thin Solid Films, vol. 386, No. 1 (2001) 91-98.

Rogers, S. et al. AMCs Comprised of Interdigital Capacitor FSS Layers Enable Lower Cost Applications. © 2003 IEEE pp. 411-414.

Rogers, S. et al. An AMC-Based 802.11a/b Antenna for Laptop Computers. © 2003 IEEE pp. 10-13.

Sievenpiper, D.F. et al. Two-Dimensional Beam Steering Using an Electrically Tunable Impedance Surface. IEEE Transactions on Antennas and Propagation 51(10). Oct. 2003. pp. 2713-2722.

Sun, J. et al. Efficiency of Various Photonic Bandgap (PBG) Structures. 3$^{rd}$ Int'l. Conf. on Microwave and Millimeter Wave Technology Proceedings 2002. pp. 1055-1058.

Tsunemine, Y. et al. Pt/BaxSr(1-x)TiO3/Pt Capacitor Technology for 0.15 micron Embedded Dynamic Random Access Memory. Jap. J. Appl. Phys. vol. 43 No. 5A (2004) 2457-2461.

Vest, R.W. Metallo-organic decomposition (MOD) processing of ferroelectric and electro-optic films: A review. Ferroelectrics, 102:1, 53-68.

Viviani, M. et al. Positive Temperature Coefficient of Electrical Resistivity below 150k of Barium Strontium Titanate. J. Amer. Ceram. Soc. vol. 87 (2004) 756-758.

Weily, A.R. et al. Antennas Based on 2-D and 3-D Electromagnetic Bandgap Materials. © 2003 IEEE pp. 847-850.

Yang, H-Y. D. et al. Surface Waves of Printed Antennas on Planar Artificial Periodic Dielectric Structures. IEEE Transactions on Antennas and Propagation 49(3). Mar. 2001. pp. 444-450.

Zhang, Y. et al. Planar Artificial Magnetic Conductors and Patch Antennas. IEEE Transactions on Antennas and Propagation 51(10). Oct. 2003. pp. 2704-2712.

Ziroff, A. et al. A Novel Approach for LTCC Packaging Using a PBG Structure for Shielding and Package Mode Suppression. 33$^{rd}$ European Microwave Conference—Munich 2003 pp. 419-422.

\* cited by examiner

| Semiconductor | Mobility @ 300 K (cm$^{-2}$/V-sec) | |
|---|---|---|
| | Electron | Hole |
| Elemental | | |
| Carbon (C) | 1,800 | 1,200 |
| Germanium (Ge) | 3,900 | 1,900 |
| Silicon (Si) | 1,500 | 450 |
| Tin (Sn) | 1,400 | 1,200 |
| IV-IV | | |
| Silicon Germanium (SiGe) | 4,300 | 850 |
| III-V Compound | | |
| Aluminum Antimonide (AlSb) | 200 | 420 |
| Gallium Antimonide (GaSb) | 5,000 | 850 |
| Gallium Arsenide (GaAs) | 8,500 | 400 |
| Gallium Phosphide (GaP) | 110 | 75 |
| Indium Antimonide (InSb) | 80,000 | 1,250 |
| Indium Arsenide (InAs) | 33,000 | 460 |
| Indium Phosphide (InP) | 4,600 | 150 |
| II-VI Compound | | |
| Cadmium Sulphide (CdS) | 340 | 50 |
| Cadmium Selenide (CdSe) | 800 | --- |
| Cadmium Telluride (CdTe) | 1,050 | 100 |
| Zinc Oxide (ZnO) | 200 | 180 |
| Zinc Sulphide (ZnS) | 165 | 5 |
| IV-VI Compound | | |
| Lead Sulphide (PbS) | 600 | 700 |
| Lead Selenide (PbSe) | 6,000 | 4,000 |

FIG. 4

Representative Grain—Grain Boundary Combinations for
Insulating/Semi-insulating/Semiconducting Grain Boundaries

| Grain Materials | | | Boundary Materials | | |
|---|---|---|---|---|---|
| | Band Gap (eV) | Column Ranking | | Band Gap (eV) | Column Ranking |
| Si | 1.11 | IV | ZnSe | 2.7 | II-VI |
| Ge | 0.67 | IV | ZnS | 3.54 | II-VI |
| SiGe | 0.67-1.11 | IV | ZnTe | 2.24 | II-VI |
| GaAs | 1.43 | III-V | CuCl | 3.4 | I-VII |
| InSb | 0.17 | III-V | AgBr | 2.5 | I-VII |
| InAs | 0.36 | III-V | LiF | 10.9 | I-VII |
| InP | 1.35 | III-V | KBr | 7.6 | I-VII |
| | | | MgF$_2$ | 12.8 | II-VI |

Table I

FIG. 11

Representative Grain—Grain Boundary Combinations for
Insulating/Semi-insulating/Semiconducting Grain Boundaries

| Grain Materials | | | Boundary Materials | | |
|---|---|---|---|---|---|
| | Band Gap (eV) | Column Ranking | | Band Gap (eV) | Column Ranking |
| HgCdTe | 0-1.5 | II-VI | SiC | 2.3-3.3 | IV |
| HgZnTe | 0.67 | II-VI | | | |

Table II

FIG. 12

SEMICONDUCTOR CHIP CARRIERS WITH MONOLITHICALLY INTEGRATED QUANTUM DOT DEVICES AND METHOD OF MANUFACTURE THEREOF

CROSS REFERENCE TO RELATED APPLICATIONS

This application claims priority from U.S. provisional application 61/409,846 entitled "QUANTUM DOT FIELD EFFECT TRANSISTOR IN A FULLY INTEGRATED SILICON CARRIER AND METHOD OF MANUFACTURE" filed Nov. 3, 2010.

FIELD OF THE INVENTION

The present invention relates generally to bulk semiconducting materials that are structurally designed and chemically engineered at nanometer dimensional scales to exhibit properties of a three-dimensional electron gas, and in particular to the incorporation of these unique semiconductor materials into a semiconductor carrier that is used to electrically interconnect additional semiconductor die comprising a larger microelectronic system with other active electrical or opto-electronic devices monolithically integrated into the carrier surface.

BACKGROUND OF THE INVENTION

The present invention relates specifically to a bulk semiconducting material that consists of a uniform distribution of nanoscale polycrystalline grains wherein the diameter of the polycrystalline grains is limited to nanometer physical dimensions such that the nanoscale texture of the semiconducting material induces quantum-size effects within the polycrystalline grains that endow the bulk semiconductor with electrical or optical properties (herein referred to as "general dielectric properties") of a three-dimensional (3D) electron gas. An additional specific embodiment of the invention relates to methods and processes that diffuse electrically conducting or electrical insulating materials into the grain boundaries of the nanoscale polycrystalline grains.

The present invention relates generally to the monolithic assembly of an active electronic, photonic, or opto-electronic device that comprises a layer of semiconductor material having thickness greater than 50 nm which exhibits the general dielectric properties of a 3D electron gas onto a semiconductor chip carrier that is used to electrically interconnect various additional semiconductor die into a more sophisticated microelectronic system. Such various active electronic or opto-electronic devices may include, but are not limited to, high power density/high-speed power management circuits, stable clock generators, electrical signal modulators, optical sensors, optical power generators, optical signal generators and/or modulators or thermoelectric systems, 1. Description of the Prior Art T. J. Phillips et al. (U.S. Pat. No. 7,173,292), (hereinafter referred to as Phillips '292), teaches that runaway currents (avalanche breakdown) caused by impact ionization in modulation-doped field effect (MODFET) or high electron mobility (HEMT) transistors applied to narrow band gap semiconductor materials is mitigated or substantially eliminated by forming a quantum well field effect transistor (QWFET). The quantum well FET consists of thin multi-layered structures comprising one or more wide band gap semiconductors. (See FIGS. 1&2). FIG. 1 depicts a vertical cross section of a QWFET 1 that comprises a quantum well region 2 embedded between two wide band gap semiconductor layers 3,4. The quantum well region 2 consists of a plurality of differing semiconductor layers 5,6,7. The central layer 6 forms a primary conduction channel that is bounded by semiconductor materials 5,7 forming secondary conduction channels having semiconductor band gaps 21,22 greater than the band gap 23 of semiconductor material that is used in the layer forming the primary conduction channel 6, but less than the band gaps 24,25 of the wide band gap semiconductor layers 3,4. FIG. 2 shows the representative energy band gap diagram 20 for the layered semiconductor structure depicted in FIG. 1 viewed from cross-sectional perspective defined by X-X'.

The field effect device is created by inserting the quantum well region 2 between two conductive doped source 8 and drain 9 regions. An electrical bias applied to the gate electrode 10 is then used to modulate current supplied to the source electrode 11 when it is collected by the drain electrode 12. The high charged carrier mobilities available in QWFET devices enable high switching speeds reported in the range between 250 GHz to 1 THz, and thus have value in high switching speed systems or millimeter-wave communications systems.

In a QWFET device, the central layer 6 must be sufficiently thin (20-50 nm) to form a 2-D electron gas through quantization effects in the quantum well contained in the primary conduction channel. The quantization effects are generated by the nanometer scale thickness of the central layer 6 and the height of the band edges 26,27 created by contacting to the semiconductor layers 5,7 that form the quantum well 28. These quantization effects create the discrete energy levels 29,30 of the high electron mobility 2-electron gas. The semiconductor layers 5,7 provide higher ionization thresholds that prevent currents flowing in the primary conduction channel in the central layer 6 from undergoing avalanche breakdown through impact ionization processes. Examples of low band gap semiconductor materials used in the primary channels are indium antimonide (InSb), indium arsenide (InAs), indium arsenic antimonide ($InAs_{(1-y)}Sb_y$), indium gallium antimonide ($In_{(1-x)}Ga_xSb$), and/or indium gallium arsenide ($In_{(1-x)}Ga_xAs$).

2. Definition of Terms

The term "active component" is herein understood to refer to its conventional definition as an element of an electrical circuit that that does require electrical power to operate and is capable of producing power gain.

The term "alkali metal" is herein understood to refer to its conventional definition meaning the group of metallic elements in column IA of the periodic table, consisting of lithium, sodium, potassium, rubidium, cesium, and francium.

The term "alkaline earth metal" is herein understood to refer to its conventional definition meaning the group of metallic elements found in column IIA of the periodic table, consisting of magnesium, calcium, strontium, barium, and radium.

The term "amorphous material" is herein understood to mean a material that does not comprise a periodic lattice of atomic elements, or lacks mid-range (over distances of 10's of nanometers) to long-range crystalline order (over distances of 100's of nanometers).

The term "chemical complexity", "compositional complexity", "chemically complex", or "compositionally complex" are herein understood to refer to a material, such as a metal or superalloy, compound semiconductor, or ceramic that consists of three (3) or more elements from the periodic table.

The term "chip carrier" is herein understood to refer to an interconnect structure built into a semiconductor substrate that contains wiring elements and embedded active components that route electrical signals between one or more integrated circuits mounted on chip carrier's surface and a larger electrical system that they may be connected to.

The term "electron gas" is herein understood to refer to its generally accepted definition as a collection of electrons (or holes) that are free to move within a modified solid via tunneling processes and have higher mobilities than they would normally have in a similar unmodified solid, wherein quantization effects generated by the solid's modification (typically nanoscale layering) induce a quantum energy well that govern and define the transport properties of the electrons (holes) and minimize interactions between the electron (holes) located within the quantum energy well.

The term "FET" is herein understood to refer to its generally accepted definition of a field effect transistor wherein a voltage applied to an insulated gate electrode induces an electrical field through insulator that is used to modulate a current between a source electrode and a drain electrode.

The term "halogen" is herein understood to refer to its conventional definition meaning the nonmetallic elements contained in column VIIA of the periodic table consisting of fluorine, chlorine, bromine, iodine, and astatine.

The term "halogenated" is herein understood to refer to its conventional definition meaning a molecule or substance that has been treated or combined with a halogen.

The term "integrated circuit" is herein understood to mean a semiconductor chip into which a large, very large, or ultra-large number of transistor elements have been embedded.

The term "LCD" is herein understood to mean a method that uses liquid precursor solutions to fabricate materials of arbitrary compositional or chemical complexity as an amorphous laminate or free-standing body or as a crystalline laminate or free-standing body that has atomic-scale chemical uniformity and a microstructure that is controllable down to nanoscale dimensions.

The term "liquid precursor solution" is herein understood to mean a solution of hydrocarbon molecules that also contains soluble metalorganic compounds that may or may not be organic acid salts of the hydrocarbon molecules into which they are dissolved.

The term "microstructure" is herein understood to define the elemental composition and physical size of crystalline grains forming a material substance.

The term "mismatched materials" is herein understood to define two materials that have dissimilar crystalline lattice structure, or lattice constants that differ by 5% or more, and/or thermal coefficients of expansion that differ by 10% or more.

The term "nanoscale" is herein understood to define physical dimensions measured in lengths ranging from 1 nanometer (nm) to 100's of nanometers (nm).

The term "opto-electronic device" is herein understood to refer to any device that uses an electrical signal to modulate an optical signal having energetic characteristics defined by the optical, infrared (near, mid or far), millimeter wave, sub-millimeter wave, or ultraviolet (near or far) regions of the electromagnetic spectrum, or visa-versa.

The term "passive component" is herein understood to refer to its conventional definition as an element of an electrical circuit that that does not require electrical power to operate and is capable of altering an electrical signal's amplitude and/or phase or being used as an energy storage device.

The term "photonic device" is herein understood to refer to a device that uses a signal having energetic characteristics defined by the optical, infrared (near, mid, or far), millimeter wave, sub-millimeter wave, or ultraviolet (near or far) electromagnetic spectrum to modulate one or more additional signal having energetic characteristics defined by the optical, infrared (near, mid, or far), millimeter wave, sub-millimeter wave or ultraviolet (near or far) regions of the electromagnetic spectrum.

The term "power FET" is herein understood to refer to the generally accepted definition for a large signal vertically configured MOSFET and covers multi-channel (MUCHFET), V-groove MOSFET, truncated V-groove MOSFET, double-diffusion DMOSFET, modulation-doped transistors (MODFET), heterojunction transistors (HETFET), and insulated-gate bipolar transistors (IGBT).

The term "quantum dot" is herein understood to apply to its conventional meaning of a material domain that is small enough to induce quantum-size effects that exhibit the electronic, optical, or opto-electronic characteristics of an electron gas.

The term "standard operating temperatures" is herein understood to mean the range of temperatures between $-40°$ C. and $+125°$ C.

The terms "tight tolerance" or "critical tolerance" are herein understood to mean a performance value, such as a capacitance, inductance, or resistance that varies less than $\pm 1\%$ over standard operating temperatures.

The term "II-VI compound semiconductor" is herein understood to refer to its conventional meaning describing a compound semiconductor comprising at least one element from column IIB of the periodic table consisting of: zinc (Zn), cadmium (Cd), or mercury (Hg); and, at least one element from column VI of the periodic table consisting of oxygen (O), sulfur (S), selenium (Se), or tellurium (Te).

The term "III-V compound semiconductor" is herein understood to refer to its conventional meaning describing a compound semiconductor comprising at least one semi-metallic element from column III of the periodic table consisting of: boron (B), aluminum (Al), gallium (Ga), and indium (In); and, at least one gaseous or semi-metallic element from the column V of the periodic table consisting of: nitrogen (N), phosphorous (P), arsenic (As), antimony (Sb), or bismuth (Bi).

The term "IV-IV compound semiconductor" is herein understood to refer to its conventional meaning describing a compound semiconductor comprising a plurality of elements from column IV of the periodic table consisting of: carbon (C), silicon (Si), germanium (Ge), tin (Sn), or lead (Pb).

The term "IV-VI compound semiconductor" is herein understood to refer to its conventional meaning describing a compound semiconductor comprising at least one element from column IV of the periodic table consisting of: carbon (C), silicon (Si), germanium (Ge), tin (Sn), or lead (Pb); and, at least one element from column VI of the periodic table consisting of: sulfur (S), selenium (Se), or tellurium (Te).

SUMMARY OF THE INVENTION

The present invention generally relates to fully integrated semiconductor chip carriers that contain systems that function at high switching speeds, and in particular to processes and methods that enable the monolithic integration of active devices comprising a bulk material layer exhibiting quantum-size effects or the characteristics of a quantum dot throughout the bulk material layer.

One embodiment of the present invention provides a three-dimensional polycrystalline semiconductor material, comprising a major ingredient forming individual crystalline grains having a nominal maximum grain diameter less than or equal to 50 nm, and a minor ingredient forming boundaries between the individual crystalline grains.

The minor ingredient may surround the crystalline grains of the major ingredient. Quantum size effects within the polycrystalline material may induce a free electron gas characteristic of a quantum well. The polycrystalline material may form a three-dimensional quantum well structure. The molar concentrations of the minor ingredient may be between 0.0001 mol % and 0.75 mol % of the polycrystalline material. The major ingredient may comprise the crystalline grains is silicon, germanium, tin, or any admixture thereof. The minor ingredient forming the grain boundaries may be an insulating, semi-insulating, or semiconducting material consisting of a metal halide comprising an alkali element from the first (I) column or an alkaline earth element from second (II) column of the periodic table, or a transition-metal having chemical properties similar to an alkali or alkaline earth metal, and a halogen element selected from the seventh (VII) column of the periodic table. The insulating or semi-insulating material has an energy band gap may be larger than the band gap of the semiconductor material comprising the polycrystalline grain. The minor ingredient forming the grain boundaries may be a conductive material consisting of an alkali element from the first (I) column or an alkaline earth element from second (II) column of the periodic table, or a transition-metal having chemical properties similar to an alkali or alkaline earth metal. The major ingredient may comprise crystalline grains is a III-V compound semiconducting material and the minor ingredient forming the boundaries may be an insulating, semi-insulating, or semiconducting material consisting of a metal halide comprising an alkali element from the first (I) column or a transition-metal having chemical properties similar to an alkali metal, and a halogen element selected from the seventh (VII) column of the periodic table. The major ingredient of the crystalline grains may be a II-VI compound semiconductor and the minor ingredient forming the boundaries is silicon, silicon carbide, germanium, tin or an admixture thereof. The polycrystalline material may have a three dimensional size that is greater than 50 nm in every direction. The polycrystalline material may be monolithically integrated into an active device. The active device may be a field effect transistor, an opto-electronic device or a photonic device. The major ingredient comprising crystalline grains may be a III-V compound semiconducting material and the minor ingredient forming the boundaries may be a conducting material consisting of an alkali element from the first (I) column or a transition-metal having chemical properties similar to an alkali metal.

Another embodiment of the present invention provides a semiconductor carrier, comprising an active device including a semiconductor layer that is monolithically integrated into the semiconductor carrier and is comprised of a nanoscale polycrystalline assembly including semiconducting crystalline grains having maximal physical dimensions in the range of 20 nm to 50 nm that are enveloped by a grain boundary material that is 2 nm to 10 nm thick, such that the quantum size effects within the polycrystalline grain induce a free electron gas characteristic of a quantum well.

The active device may be a field effect transistor, an opto-electronic device or a photonic device. The active device may comprise a power management module monolithically integrated on to its surface. The active device may comprise a semiconductor die. The semiconductor carrier may have active circuitry embedded within the carrier substrate.

Yet another embodiment of the present invention provides a method of fabricating a semiconductor layer comprised of a nanoscale polycrystalline assembly including semiconducting crystalline grains having maximal physical dimensions in the range of 20 nm to 50 nm that are enveloped by a grain boundary material that is 2 nm to 10 nm thick, such that the quantum size effects within the polycrystalline grain induce a free electron gas characteristic of a quantum well, comprising the steps of forming a solution of low volatility liquid metalorganic precursors having stoichiometric ratios suitable for producing majority phase polycrystalline grains consisting of an elemental semiconductor or a desired compound semiconductor stoichiometry; adding to said solution dopants in concentrations in the range of 0.0001 mol % to 0.5 mol % having stoichiometric ratios suitable for producing an insulating, semi-insulating, or semiconducting secondary phase material in the grain boundary of the majority phase polycrystalline grains; adding to said solution precursors for the dopants to the majority phase polycrystalline grains in the concentrations desired within the polycrystalline grains, heating a substrate upon which the semiconductor layer will be formed a temperature in the range of 250° C. to 500° C.; simultaneously decomposing the non-volatile metalorganic precursors on the substrate in an inert or reducing gas atmosphere to form an amorphous deposit having stoichiometric precision that is chemically uniform at the atomic scale; baking said amorphous deposit to remove organic residue from the deposit; annealing said baked deposit for a minimum of 5 seconds in ionized argon plasma using an applied power of 50 W to 300 W at a substrate temperature between 40° C. and 400° C. and a pressure in the range of 1,500 mTorr to 5,000 mTorr; and optionally adding nitrogen, and/or reducing partial pressure ratios of carbon dioxide and carbon monoxide to the ionized argon plasma.

The semiconducting material of the crystalline grains may be silicon, germanium, tin, or any admixture thereof. The grain boundary material may be an insulating, semi-insulating, or semiconducting material consisting of a metal halide comprising an alkali element from the first (I) column or an alkaline earth element from second (II) column of the periodic table, or a transition-metal having chemical properties similar to an alkali or alkaline earth metal, and a halogen element selected from the seventh (VII) column of the periodic table. The insulating or semi-insulating material may have an energy band gap that is larger than the band gap of the semiconductor material comprising the polycrystalline grain. The semiconductor material of the crystalline grains may be a III-V compound semiconducting material and the grain boundary material is an insulating, semi-insulating, or semiconducting material consisting of a metal halide comprising an alkali element from the first (I) column or a transition-metal having chemical properties similar to an alkali metal, and a halogen element selected from the seventh (VII) column of the periodic table. The semiconducting crystalline grains may be a II-VI compound semiconductor and the grain boundary material may be silicon, silicon carbide, germanium, tin or an admixture thereof.

BRIEF DESCRIPTION OF THE DRAWINGS

The present invention is illustratively shown and described in reference to the accompanying drawings, in which:

FIG. 4 is a table listing charged carrier mobilities in various elemental and compound semiconductors.

FIG. 11 is a Table I showing Representative Grain—Grain Boundary Combinations for Insulating/Semi-insulating/Semiconducting Grain Boundaries for certain materials.

FIG. 12 is a Table II showing Representative Grain—Grain Boundary Combinations for Insulating/Semi-insulating/Semiconducting Grain Boundaries for certain materials.

DESCRIPTION OF THE PREFERRED EMBODIMENT

Figure 1:
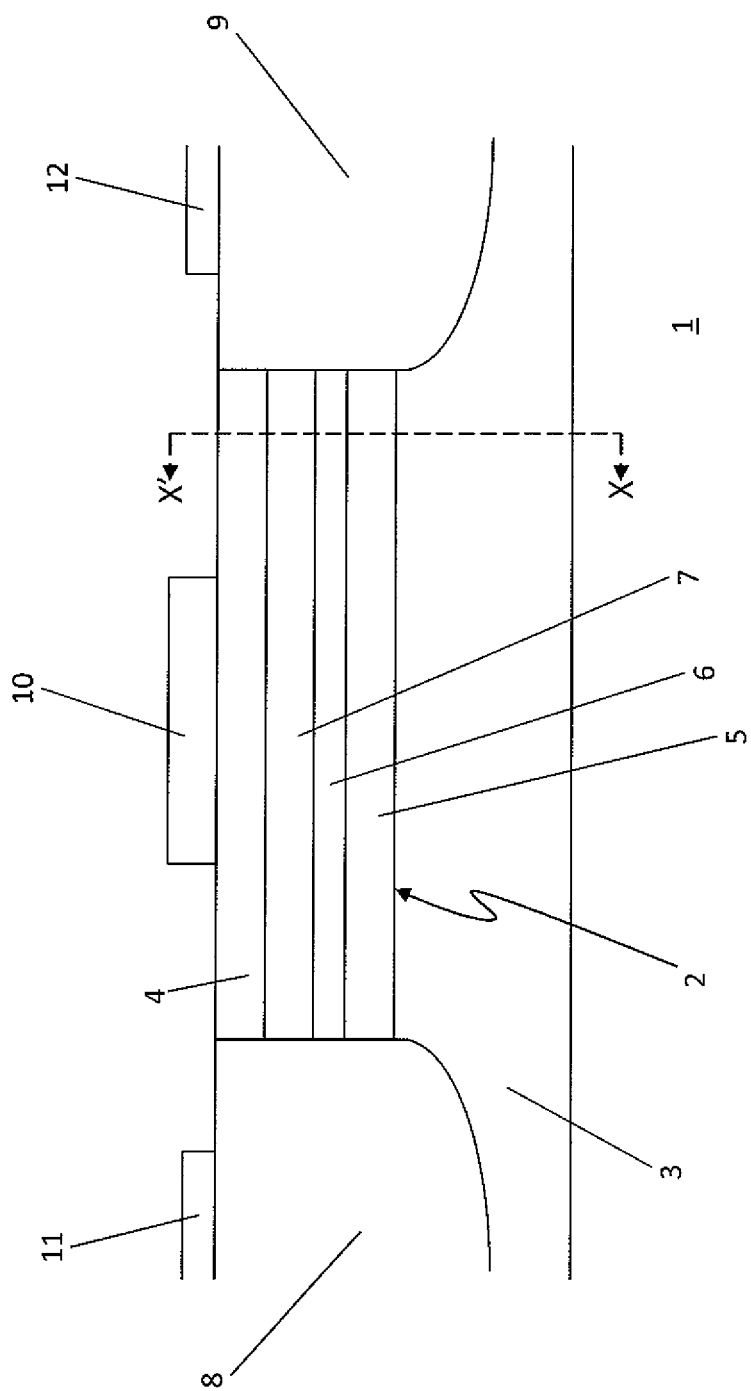
FIG. 1 depicts the physical structure of a prior art quantum well field effect transistor.

This application is copending with de Rochemont U.S. Ser. No. 13/168,922, entitled "SEMICONDUCTOR CARRIER WITH VERTICAL FET POWER MODULE", filed Jun. 24, 2011 (de Rochemont '922), and de Rochemont U.S. Ser. No. 13/163,654, entitled "FREQUENCY-SELECTIVE DIPOLE ANTENNA", filed Jun. 17, 2011 (de Rochemont '654), which are incorporated herein by reference. The current application instructs means to insert a bulk semiconductor layer into an active component integrated on a semiconductor carrier, where the bulk semiconductor layer has thickness greater than 50 nm and exhibits general dielectric properties of an electron gas. One counterpart application (de Rochemont '922) instructs means to fully integrate a high efficiency, power management system as a monolithic structure on a semiconductor carrier to modulate high current levels using a resonant three-dimensional gate structure enabled by serpentine windings. The other counterpart application, (de Rochemont '654), instructs methods to form a conducting element as a serpentine winding by folding the conducting element in ways that introduce localized regions of capacitive or inductive loading, such that the combination of localized reactive loads along the length of the folded conductor form a distributed network filter. It goes on to illustrate how two mirror image serpentine elements so formed function as a dipole antenna that is resonant over selective frequencies. The counterpart application de Rochemont '654 also instructs the insertion of tight-tolerance electroceramic material within the regions of localized reactive loading to increase or more precisely tune the coupling strength of localized reactive loads. The current application is also filed jointly with de Rochemont U.S. Ser. No. 13/216,692, entitled "POWER FET WITH RESONANT TRANSISTOR GATE", filed Aug. 23, 2011 (de Rochemont '692), which is incorporated herein by reference. The co-pending application de Rochemont '692 instructs a power management module that modulates large currents at low current densities at pre-determined frequencies and methods to form the power management module on a semiconductor carrier.

The current application incorporates by reference all matter contained in de Rochemont, U.S. Ser. No. 11/479,159, filed Jun. 30, 2006, entitled "ELECTRICAL COMPONENT AND METHOD OF MANUFACTURE" (the '159 application), de Rochemont, U.S. Ser. No. 11/620,042 filed Jan. 6, 2007 entitled "POWER MANAGEMENT MODULES" (the '042 application), de Rochemont and Kovacs, U.S. Ser. No. 12/843,112 filed Jul. 26, 2010, "LIQUID CHEMICAL DEPOSITION PROCESS APPARATUS AND EMBODIMENTS", (the '112 application), de Rochemont U.S. Ser. No. 13/152,222, entitled "MONOLITHIC DC/DC POWER MANAGEMENT MODULE WITH SURFACE FET", filed Jun. 2, 2011 (the '222 application), and de Rochemont, U.S. Ser. No. 13/182,405, entitled "CUTTING TOOL AND METHODS OF MANUFACTURE", filed Jul. 13, 2011 (the '405 application). The '159 application discloses how LCD methods fabricate a monolithic integrated circuit comprising tight tolerance passive networks. The '042 application discloses how liquid chemical deposition ("LCD") methods fabricate a monolithic integrated power management module that includes a tunable inductor coil. The '112 application discloses preferred apparatus used in applying LCD methods. The '222 application instructs the monolithic integration of a low-loss power management circuit containing a surface FET. The '405 application discloses LCD methods to fabricate carbide, nitride and MAX-phase materials, such as silicon carbide, or complex chemistries that incorporate silicon and carbon elements.

Figure 3:
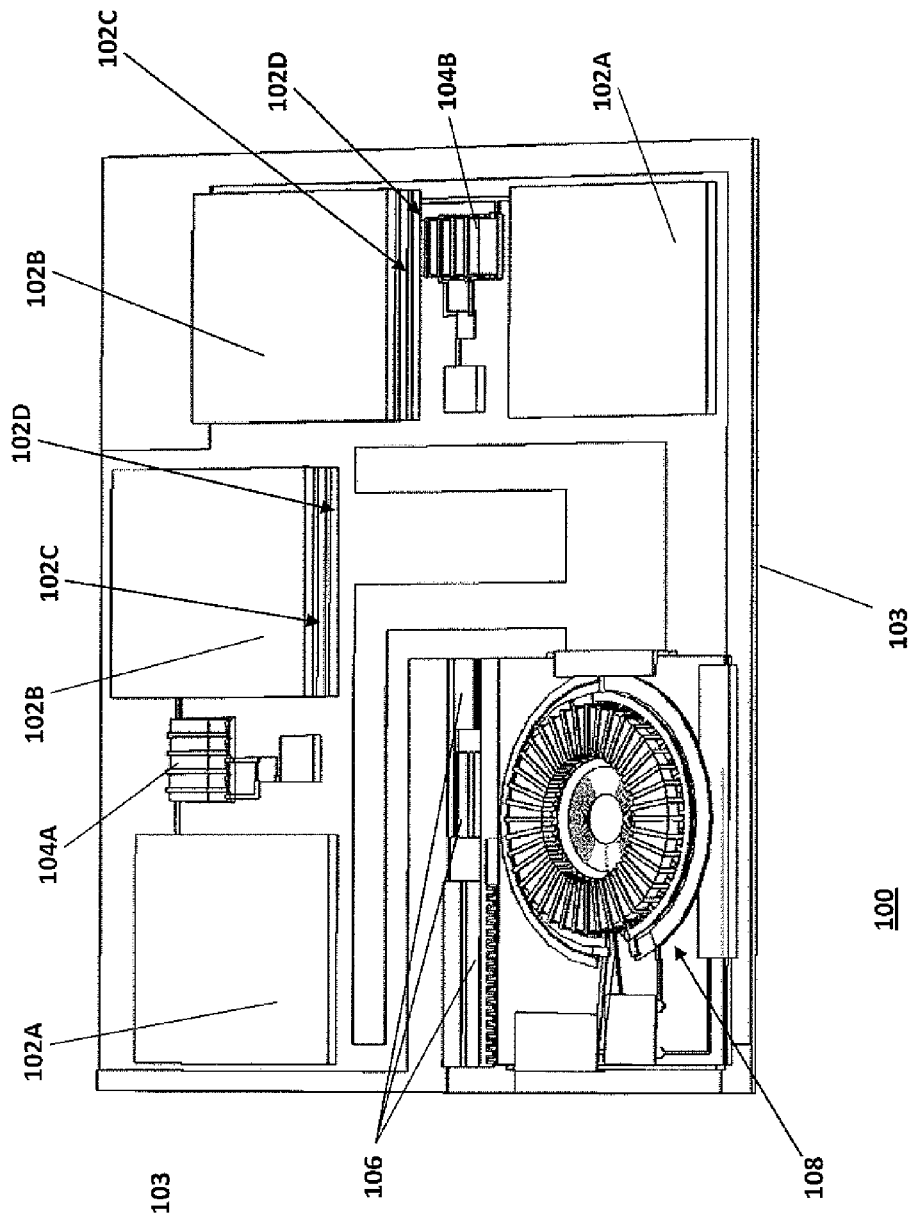
FIG. 3 depicts a fully integrated silicon chip carrier.

Reference is now made to FIGS. 3-10 to better illustrate the significance of this invention. FIG. 3 depicts a semiconductor chip carrier 100. The present invention may be applied to high-speed computing modules, RF radio modules, fully integrated radar modules, photonic modules, and opto-electronic modules. It may also apply to any circuit containing such a module or combination of the aforementioned modules that requires high power densities and high switching speed circuitry. As depicted herein, the semiconductor chip carrier 100 contains a plurality of integrated circuits (semiconductor chips) 102A, 102B, 102C, 102D mounted either in discrete or stacked configuration on the carrier substrate 103. The carrier substrate 103 is a larger semiconductor chip that has electrically conductive traces on its surface that are used to interconnect various components mounted or integrated thereupon. Additional low-level active circuitry, (not shown for clarity), may be embedded within the carrier substrate 103. Such low-level active circuitry may include, but need not be limited to, latching, sensing, switching and signal drift circuitry useful in bus management systems. LCD processes may be used to integrate additional circuitry on the surface of the carrier substrate 103, that may include, but need not be limited to, critical tolerance inductor coils 104A, 104B are used to form a tight tolerance LC circuit that stabilizes or actively tunes circuit clocking speeds, and/or passive networks 106 that are monolithically formed on the surface of the carrier substrate 103.

It is anticipated that the integrated circuit semiconductor die 102 will have power demand requirements in excess of 750 W-inch$^2$ as semiconductor manufacturing tolerances progress beyond the 22 nm line feature node. High-efficiency, high-speed fully integrated power management modules 108 are monolithically formed on the chip carrier 100, using methods and embodiments detailed in the '042, '122, '159, '222, '654, '692, '922 applications incorporated herein by reference. These methods and embodiments may be used to optimize data transfer between memory devices and processor die, or other semiconductor die co-located on the semiconductor carrier 100.

Reference is now made to FIGS. 4-8A,8B,8C,8D to describe how unique attributes of LCD manufacturing methods are applied to integrate semiconductor layers having thicknesses greater than 20-50 nm that are endowed with nanoscale microstructures necessary to generate three-dimensional (3D) electron gases within a semiconductor layer. As disclosed in the above referenced applications, LCD manufacturing methods allow dissimilar and "mismatched" materials with atomic-scale chemical uniformity and stoichiometric precision to be integrated in selected areas on the surface of semiconductor substrate with surface adhesion that is stronger than the tensile strength of the deposited material. Unlike conventional material deposition techniques, LCD places no restriction on the number of elemental (chemical) components that can be incorporated with high compositional precision into the deposited material, which enables materials having high chemical complexity to be integrated into a monolithic structure. The low process temperatures ($\leq 400°$ C.) used by LCD do not alter dopant profiles of active components buried within the semiconductor substrate. These low deposition temperatures allow the LCD deposit to initially form as a uniform solid solution. This, in turn, provides means to form microstructures in LCD deposits that are restricted to nanoscale dimensions by the subsequent application of rapid thermal annealing processes. Uniform chemical distribution and nanoscale microstructures (crystalline grain size) are a necessary condition to integrate electroceramic passive components having functional properties that remain stable with varying temperature, which satisfies critical performance tolerances needed to make the monolithic integration of passive circuitry within system-in-package (SiP) or a system-on-chip (SoC) economically viable. These unique attributes also enable the nanoscale modification of polycrystalline semiconductor materials that comprise a uniform assembly of granular quantum wells needed to form a 3D electron quantum gas.

FIG. 4 presents a table listing the charged carrier (electron-hole) mobilities of various semiconductors that can be used by the present invention. Higher switching speeds are enabled in semiconductor systems that have higher charged carrier mobility. As instructed by the prior art (see FIGS. 1 & 2), ultra-high speed field effect transistors (FETs) are constructed using high charged carrier mobility semiconductor materials. These semiconductor materials typically have low effective electron mass, large ballistic mean free path and high saturation velocities. Preferred high carrier mobility semiconductor materials, such as indium antimonide (InSb), typically have low band gap energies, which makes them prone to avalanche breakdown generated by impact ionization. Since the impact ionization threshold essentially corresponds to the material band gap, the electric fields generated from relatively low source-drain voltages ($V_{DS}$) will give rise to avalanche breakdown and runaway currents that risk linear response and thermal runaway. Avalanche breakdown prevents high-speed FETs from being used in applications requiring relatively high operational voltages, such as modulators, amplifiers or FET-based logic devices, it also restricts high frequency gain values. These constraints inhibit application in systems where high power frequency signal amplification or management is desirable, such as high-speed computing or mobile communications platforms. Electron gases formed within quantum wells can further reduce effective electron mass and minimize avalanche breakdown in low band gap semiconductors.

Figure 2:
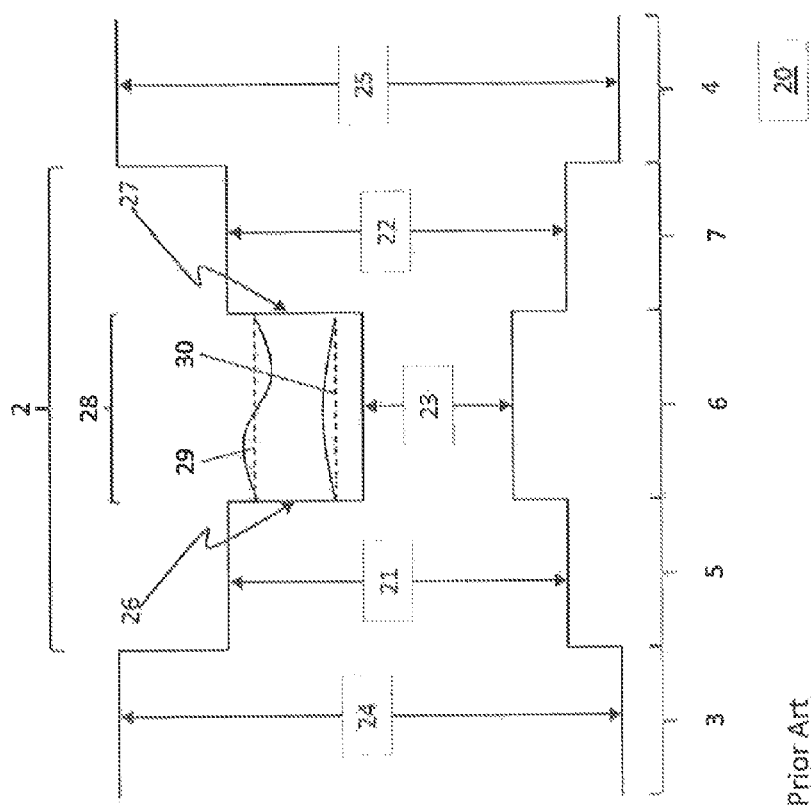
FIG. 2 depicts the energy band diagram of the quantum well device of FIG. 1.

The prior art of FIGS. 1 & 2 instructs that runaway currents can be curtailed in low band gap semiconductors by forming a planar quantum well 28 by sandwiching the high carrier mobility/low band gap energy semiconductor as an ultra-thin layer 6 (20-50 nm thick) between layers 5,7 of a wider band gap semiconductor material, which in turn are sandwiched by layers 3,4 of an even wider band gap semiconductor. The narrow thickness of the ultra-thin layer 6 induces quantization effects within the quantum well 28 confined by energy band edges 26,27. These quantization effects produce a 2D-electron gas having high electron mobility within the primary conduction channel defined by the quantum well 28. The adjacent layers 5,7 comprising wider band gap semiconductor are selected to have conduction bands 21,22 that are close to the impact ionization threshold of the semiconductor material contained in the primary conduction channel 6. This enables a secondary channel. Since the width of the secondary conduction channel 2 is greater than the dimensions needed to induce quantization effects, a 2D-electron gas is only created in the quantum well 28 of the primary conduction channel. This leads to a tradeoff that diminishes switching speeds, but mitigates avalanche currents by allowing some of the carriers that would otherwise reach impact ionization thresholds in the primary conduction channel 28 to be diverted to the secondary channel 2, which has higher ionization thresholds. The prior art instructs that the semiconductor material used in the primary and secondary conduction channels in an ultra-high speed FET be formed using epitaxial methods to produce crystalline semiconductor that maximizes the carrier mobility, velocity and mean free path.

While the prior art teaches the use of multi-layer structures that induce 2D-electron gases within an ultra-thin plane of the ultra-high speed FET, the limitation restricting the primary conduction channel to thicknesses of 20-50 nm limits the overall currents that can be channeled through the high-electron mobility layers. Ultra-thin layers will cause high current densities that rapidly increase the probability of impact ionization and avalanche currents even at low power levels. Therefore, it is desirable to develop methods and embodiments that induce high electron mobility in semiconductor materials having thicknesses greater than 20-50 nm to reduce power densities in the high-speed layer. Higher currents can be achieved under the prior art, by creating multiple multi-layer structures comprising primary and secondary conduction channels. It is therefore desirable to produce a quantized conduction channel that has considerably greater thickness since the approach using multiple multi-layer structures has substantially higher cost and limited economic value when compared to a similar device that enables electron gas properties in a single semiconductor layer that is thicker than 20-50 nm. It is also desirable to develop methods and embodiments that enable electron gases in wider band gap semiconductor materials to better manage impact ionization thresholds.

Figure 5A:
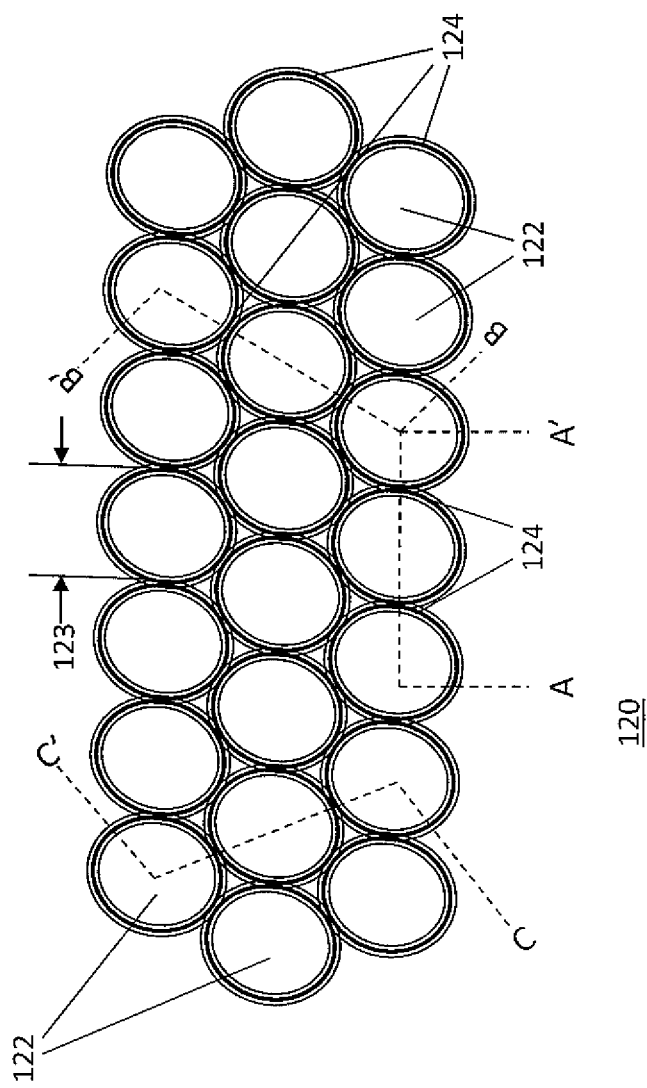
FIG. 5A depicts a polycrystalline semiconductor containing nanoscale grains that have metallic elements lodged within the grain boundaries.
Figure 5B:
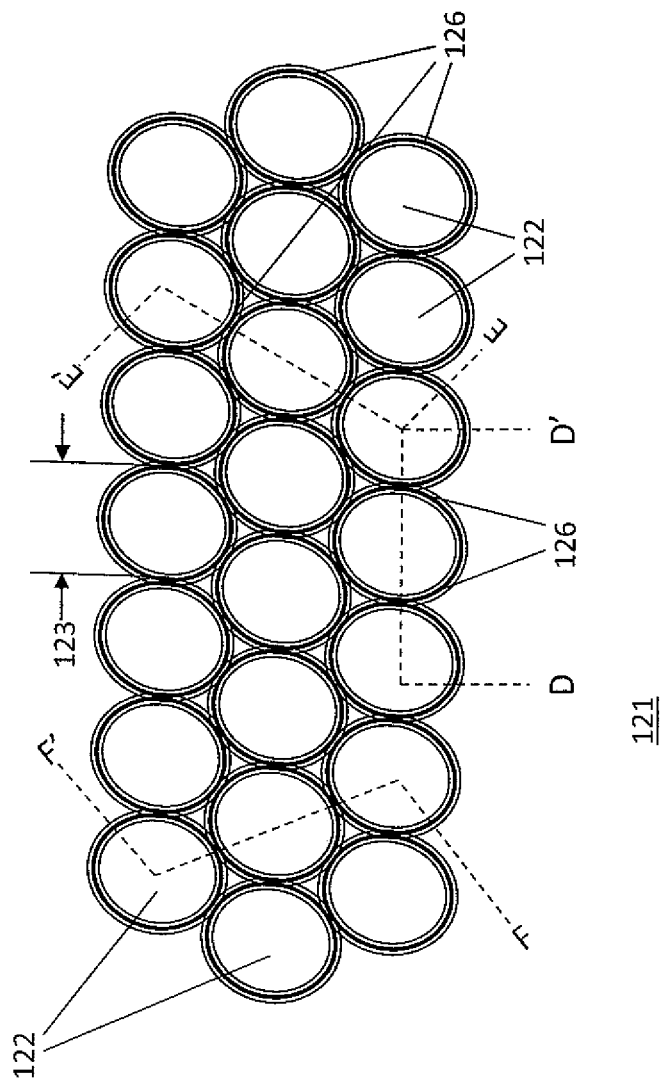
FIG. 5B depicts a polycrystalline semiconductor containing nanoscale grains that have insulating compounds lodged within the grain boundaries.

Reference is now made to FIGS. 5A,5B,6A,6B to illustrate how the nanoscale microstructure controls enabled by LCD manufacturing methods are used to produce semiconductor layers that have three-dimensional (3D) electron gases. FIGS. 5A,5B show cross sections of three dimensional microscopic volumes of polycrystalline semiconductor material 120 that consists of matrix of semiconducting grains 122 that have a maximum physical dimension 123 less than 50 nm in diameter, preferably a maximum physical dimension 123 in the range of 20-50 nm. The polycrystalline material may comprise an elemental semiconductor, such as silicon or germanium, a IV-IV semiconductor, containing a plurality of elements from column IV of the periodic table, or consists of III-V semiconducting compounds, more preferably compositionally complex III-V semiconducting compounds. Depending upon the device application, certain aspects of the present invention would favor the use of II-VI or IV-VI compound semiconductors, preferably compositionally complex II-VI or IV-VI compound semiconductors.

Ordinarily, polycrystalline semiconductors have greatly reduced charge carrier mobilities due to the reduced mean free paths caused by the lattice dislocations encountered as the charge carrier attempts to navigate the grain boundary. However, maximum physical dimensions 123 in the range 20-50 nm are small enough to form quantum wells that induce quantization effects as each grain 122 of the polycrystalline semiconductor material 120 becomes a quantum dot within the bulk material when a chemically distinct material envelops the grain 122 at the grain boundaries 124,126. The quantum dot thereby produces a three-dimensional (3D) electron gas within each grain 122. Quantum tunneling mechanisms represent the fastest charge transfer mechanism across an energy barrier, occurring at femtosecond time periods, an additional preferred aspect of the present invention strengthens the energy barrier by optionally enveloping the semiconducting grains 122 with thin layers (2-10 nm thick, preferably 2-5 nm thick) of metallic grain boundary material 124 (FIG. 5A) or insulating grain boundary material 126 (FIG. 5B). The quantization effects induced by the phase-separated materials diffused into the grain boundaries are shown in FIGS. 6A,6B.

Figure 6A:
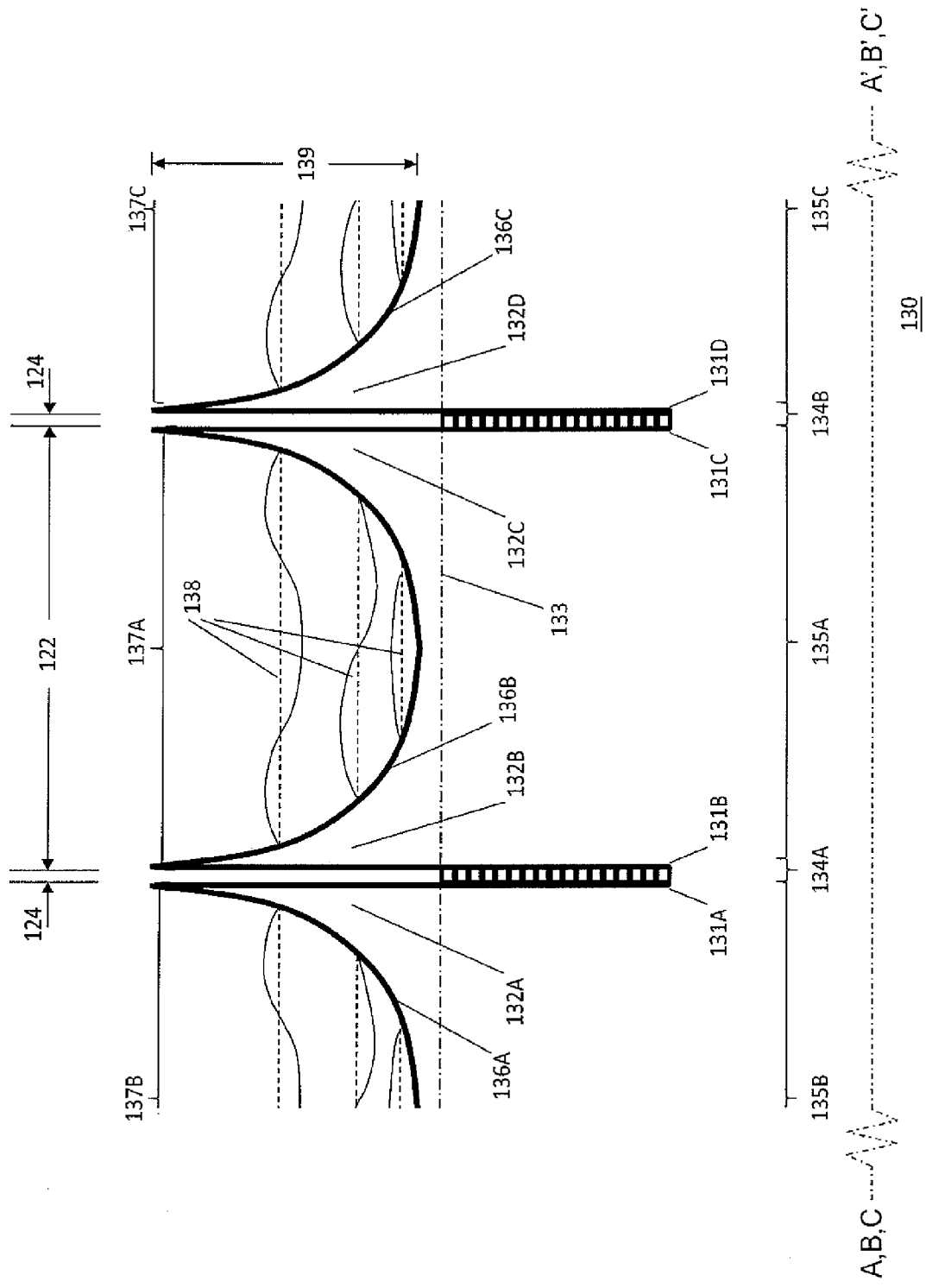
FIG. 6A depicts a two-dimensional (2-D) image of the energy band structure of a three-dimensional (3-D) quantum-dot semiconductor layer formed within a polycrystalline semiconductor matrix comprised of nanoscale grains that have metallic elements lodged within the grain boundaries.
Figure 6B:
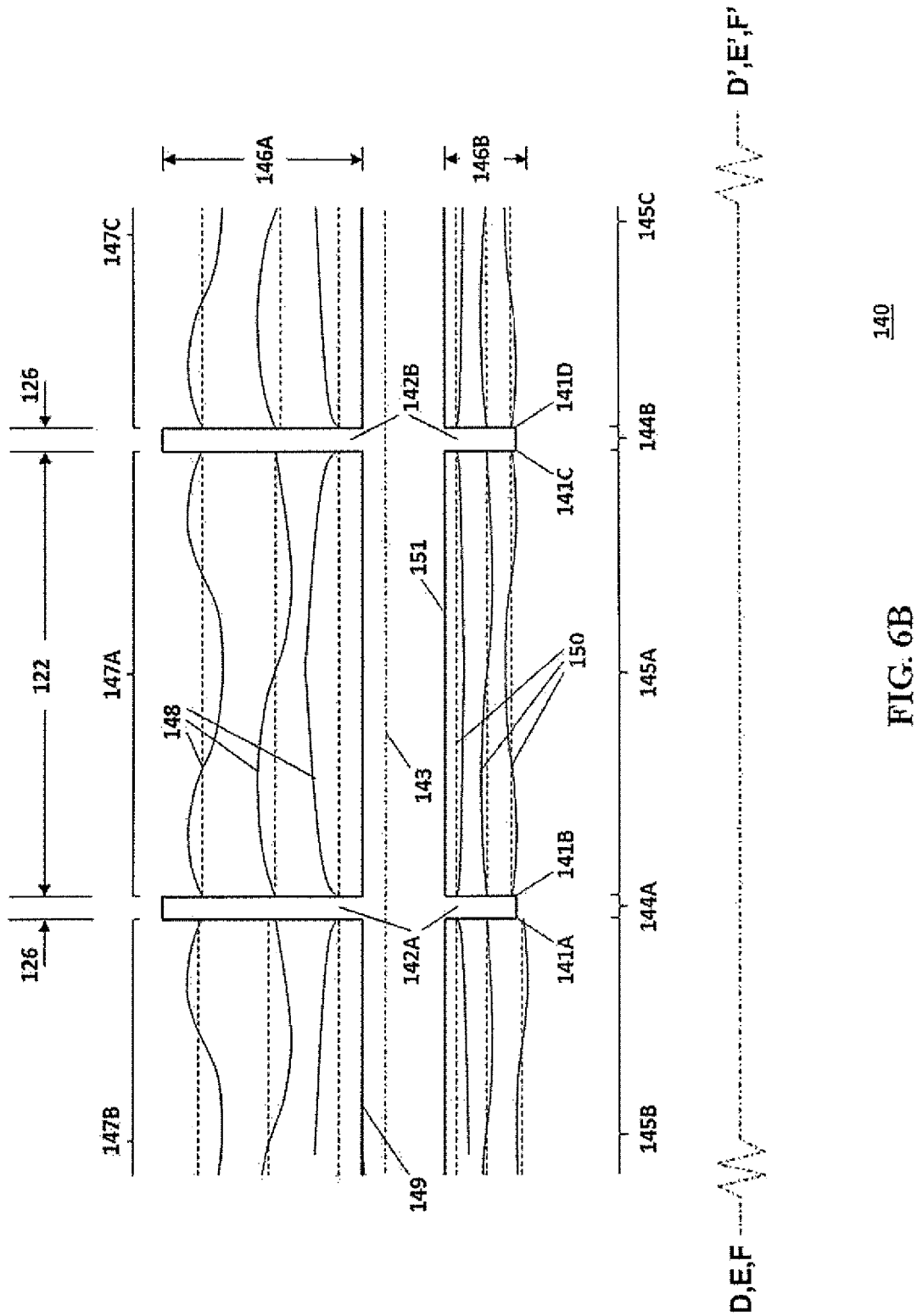
FIG. 6B depicts a two-dimensional (2-D) image of the energy band structure of a three-dimensional (3-D) quantum-dot semiconductor layer formed within a polycrystalline semiconductor matrix comprised of nanoscale grains that have insulating compounds lodged within the grain boundaries.

FIG. 6A depicts the energy band diagrams 130 of a 3D-electron gas, as viewed along any of the cross-sections A-A', B-B', C-C' (FIG. 5A), that are established by the junctions created when 20-50 nm polycrystalline semiconducting grains 122 are enveloped by metallic grain boundary material 124, which has a thickness ranging from 1 nm to 10 nm, but is preferably in the range of 2-4 nm. The metal-semiconductor interfaces 131A,131B,131C,131D form junction barriers 132A,132B,132C,132D through the equilibration of the Fermi level 133 in metallic grain boundaries 134A,134B and the semiconducting grains 135A,135B,135C. The equilibration process will cause electrons in the metallic grain boundaries and holes in the semiconducting grains to collect at the interface. The strong depletion fields in the semiconductor regions will cause the conduction bands 136A,136B,136C to bend thereby producing energy wells 137A,137B,137C that quantize the electron energy levels 138 in the conduction bands to form a 3D-electron gas. At metal-semiconductor junctions, the height 139 of the junction barriers ($\phi_B$) 132A,132B,132C,132D between the quantum energy wells 137A,137B,137C generally given by:

$$q\phi_B = q(\phi_m - \chi) \quad (1)$$

where q is the electron charge, $\phi_m$ is the metal work function and $\chi$ is the semiconductor electron affinity. Conduction electrons injected into and contained within the quantized energy levels 138 will tunnel through the junction barriers ($\phi_B$) 132A,132B,132C,132D at femtosecond transit speeds, which thereby makes very fast semiconductor switching speeds possible when these materials are configured in field effect transistor structures. The thin metallic grain boundary material 124 is a limitation in an FET-switched device as it will carry leakage currents that are undesirable in most applications. Therefore, it is preferable to form the polycrystalline semiconductor 121 that has electrically insulating or semi-insulating/semiconducting grain boundary material 126 enveloping the semiconductor grains 122 as depicted in FIG. 5B. Abrupt junctions between the insulating grain boundary material 126 and the semiconductor grain 122 will produce characteristically different quantum well structures. FIG. 6B depicts the energy band diagrams 140 of a 3D-electron gas, as viewed along any of the cross-sections D-D', E-E', or F-F' (see FIG. 5B) that are established by the junctions created when 20-50 nm polycrystalline semiconducting grains 122 are enveloped by an insulating grain boundary material 126, which has a thickness ranging from 1 nm to 10 nm, but is preferably in the range of 2-5 nm. Alternatively, the insulator may alternatively be a wider band gap semiconductor to produce a heterojunction between the grain 122 and the grain boundary 126 materials. The insulator-semiconductor interfaces 141A,141B,141C,141D form junction barriers 142A,142B through the equilibration of the Fermi level 143 in insulating grain boundaries 144A,144B and the semiconducting grains 145A,145B,145C. The offsets in the conduction band edges 146A and valence band edges 146B between in the semiconductor and insulator regions will create energy wells 147A,147B,147C in the semiconductor grains 145A,145B,145C that quantize the electron energy levels 148 in the conduction bands 149 to form a 3D-electron gas. Similar quantization occurs in the hole energy levels 150 in the valence bands 151 of the semiconductor grains 147A,147B,147C. Since the semiconductor material is polycrystalline, the charge carriers have very short mean free paths (20-50 nm) and ballistic conduction currents never achieve the high velocities needed to generate impact ionization. Furthermore, tunneling currents having femtosecond transit times dominate conduction mechanisms between quantum wells in this polycrystalline semiconductor material. These transport processes enable fast switching speeds and reduce the risk of avalanche breakdown as ballistic electrons never form and the quantum energy wells distributed throughout the solid effectively shield atoms in the crystal lattice from the conducting electrons. A 3D electron (hole) gas is formed since the grains are roughly spherical and trap electrons in a three-dimensional quantum energy well through which the electrons may tunnel in all directions.

As discussed in greater detail below, thermodynamic and/or chemical incompatibility is required to phase separate the grain material from the grain boundary material while processing the polycrystalline grains. As shown in Tables I & II (FIGS. 11 and 12), insulating, semi-insulating or semiconducting grain boundary materials 126 that consist primarily of elements found in a column of the periodic table that is separated by at least 2 or 3 columns from the elements comprising the nanoscale polycrystalline grains achieves this thermodynamic/chemical incompatibility. Table I lists representative combinations of group IV and III-V compound semiconductors (left hand side) that can be used within grains 122 that are enveloped by insulating, semi-insulating, or wide band gap II-VI and/or I-VII semiconductor materials located in the grain boundaries 126. Table II lists representative combinations of low band gap II-VI compound semiconductors (left hand side) that can be used within grains 122 that are enveloped by insulating, semi-insulating, or wide band gap group VI semiconductor materials located in the grain boundaries 126. Similar relationships with respect to column ranking apply when enveloping semiconducting grains 122 with conductive grain boundary materials 124. Since LCD manufacturing methods enable the chemical integration of high chemical complexity materials, it should be clearly understood that III-V and II-VI semiconducting compounds need not be limited to binary compositions, but can easily comprise 3 or more elemental components.

Figure 7:
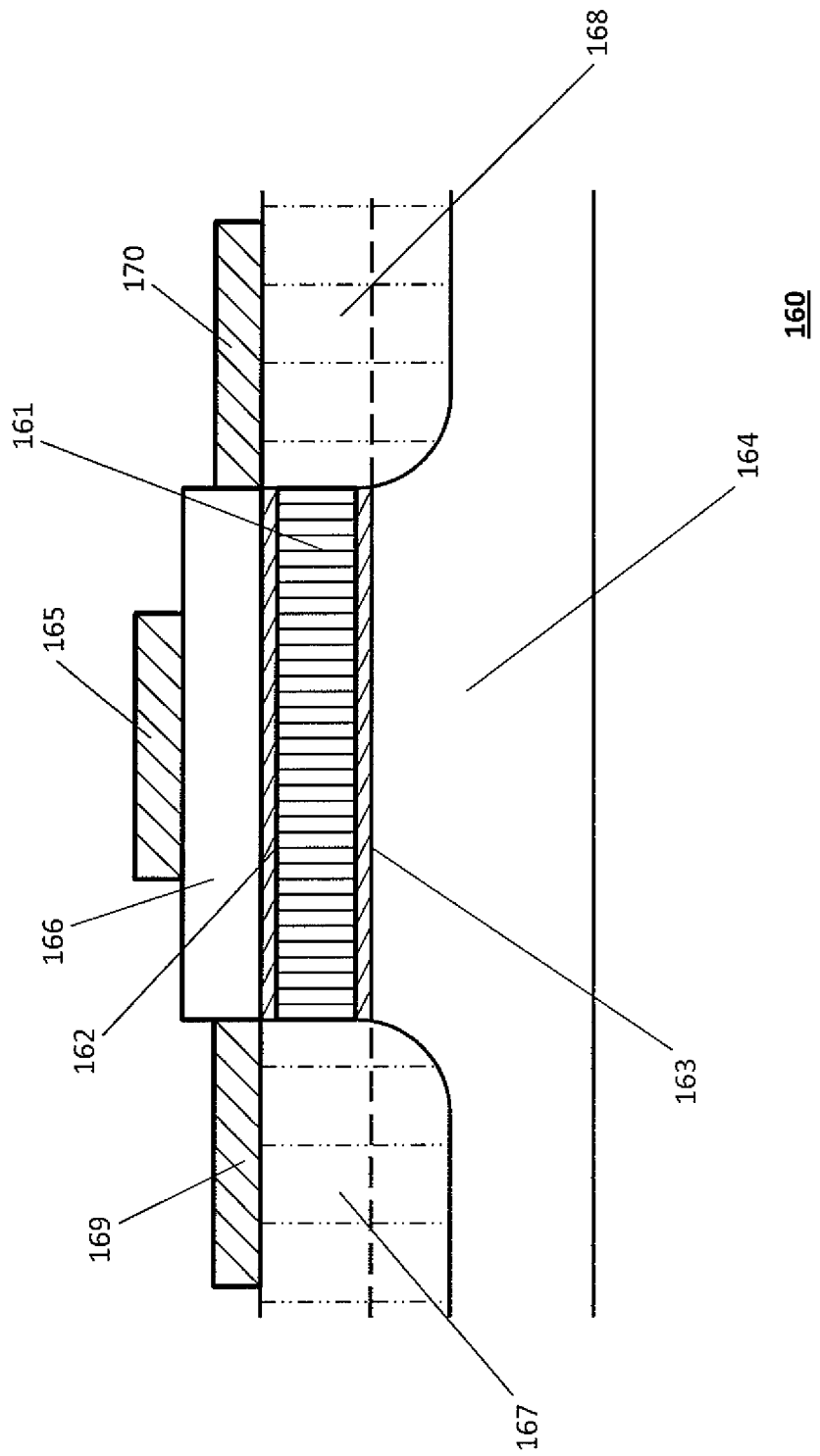
FIG. 7 provides a cross-sectional view of a quantum dot field effect transistor.

The principal advantage afforded by these polycrystalline semiconductors is that devices having arbitrarily thick conduction channels can be easily constructed in contrast to the prior art in which the primary conduction channels 6 are limited to 20-50 nm layer thicknesses as shown in FIG. 1. FIG. 7 depicts a significant aspect of the present invention, which provides means to construct a electrically active field, field effect transistor (FET) device 160 that can carry more substantial currents than the prior art. Since polycrystalline semiconductor reduces the mean free path of conduction electrons and the associated risk of avalanche breakdown caused by high ballistic velocities, the 3-D electron (and hole) gas(es) produced therein do not need to be confined in thin primary conduction channels 6 surrounded by one or more wider band gap semiconductor layers 7,8, and 3,4. Under the present invention, the primary conduction channel 161 may have polycrystalline semiconductor layer thickness ranging from 20 nm to 10 microns (μm), preferably greater than 50 nm and most likely 1-2 μm, thereby allowing much higher currents to be modulated at significantly lower current densities. Since the present invention forms the electron gas by the nanoscale microstructure of the semiconductor layer itself rather than the quantum-size effects induced by the energy barriers between semiconductors, it enables the use of wide band gap material in the conduction channel, such as silicon ($E_{gap}$=1.11 eV) or gallium arsenide ($E_{gap}$=1.43 eV) that is less susceptible to impact ionization than the low band gap counterparts like indium antimonide ($E_{gap}$=0.17 eV). In cases where it might be advantageous to insert a low band gap material in a conduction channel thicker than 50 nm, the conduction channel may optionally have additional layers 162,163 comprising a wider band gap semiconductor material inserted between it and the substrate 164 and/or the gate electrode 165. Voltages applied to the gate electrode 165 are used to vary electric fields through the gate oxide 166 to modulate current flow in the primary conduction channel 161 between the source 167 and the drain 168 regions. Electrical contact is made to the source 167 and drain 168 regions using an ohmic source electrode 169 and drain electrode 170, respectively.

Since the modulated currents multilayer 2D-electron gas structures instructed by the prior art limit high-speed current transport to primary conduction channel(s) 6 that are 20-50 nm thick, forty (40) to one hundred (100) such layers would be required to transport equivalent currents in a single two (2) micron thick 3D-electron gas primary conduction channel 161 described by the present invention. The high-speed quantum dot field effect transistor may be integrated in any circuit using LCD methods, apparatus, and processes, including, but not limited to, power management devices or silicon carriers that are used in high-speed computing processes or radio applications.

Figure 8A:
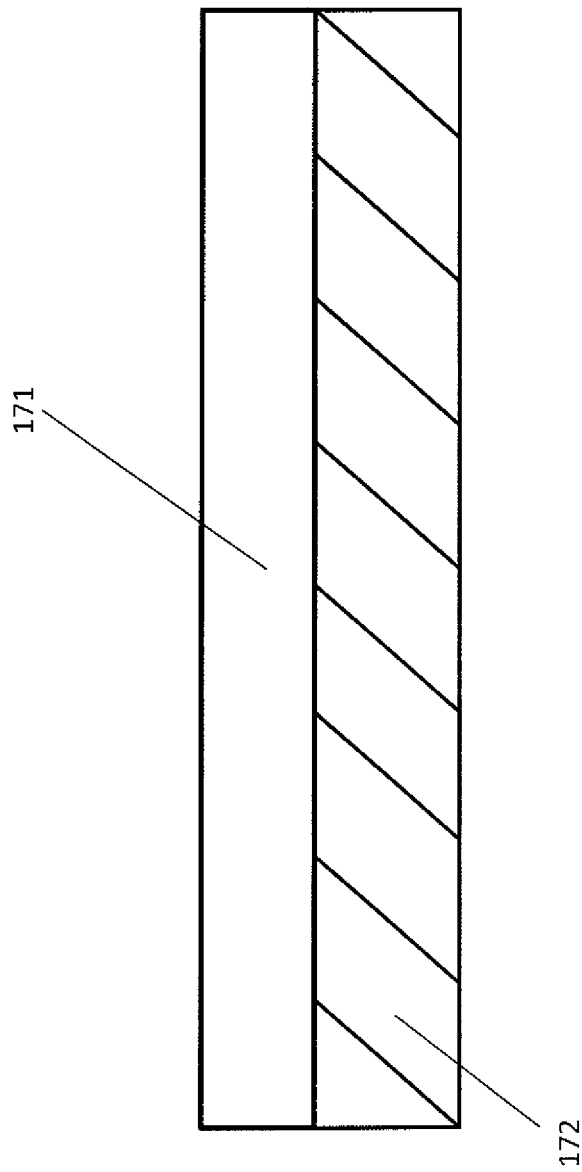
FIGS. 8A,8B,8C are cross-sectional substrate views used to depict the method for making the semiconductor layer of a quantum well field effect transistor using a halogenated metalorganic precursor compound.
Figure 8B:
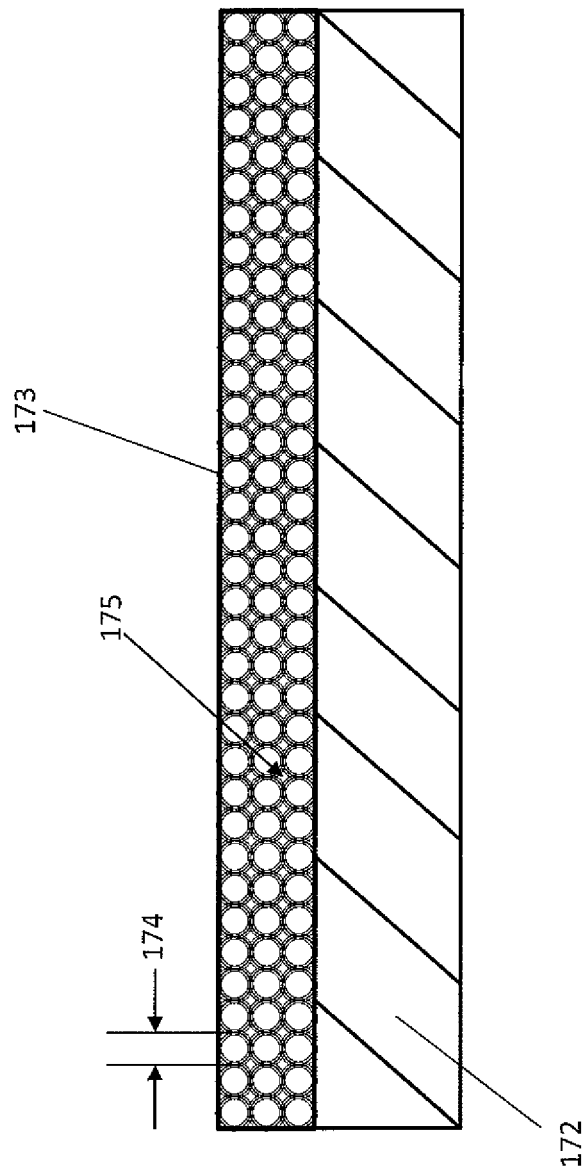
Figure 8C:
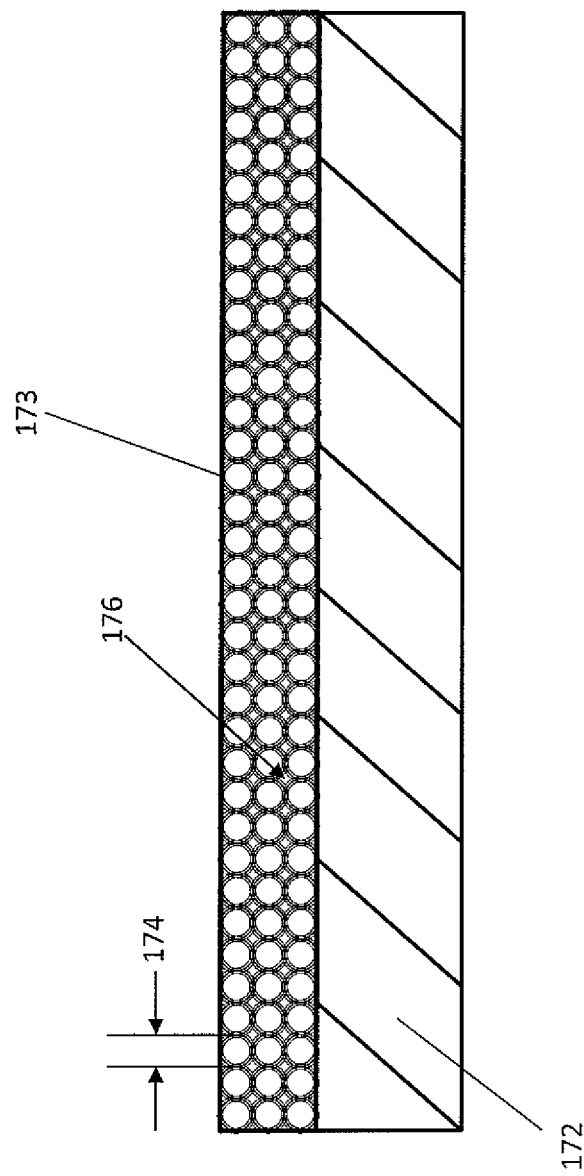
Figure 8D:
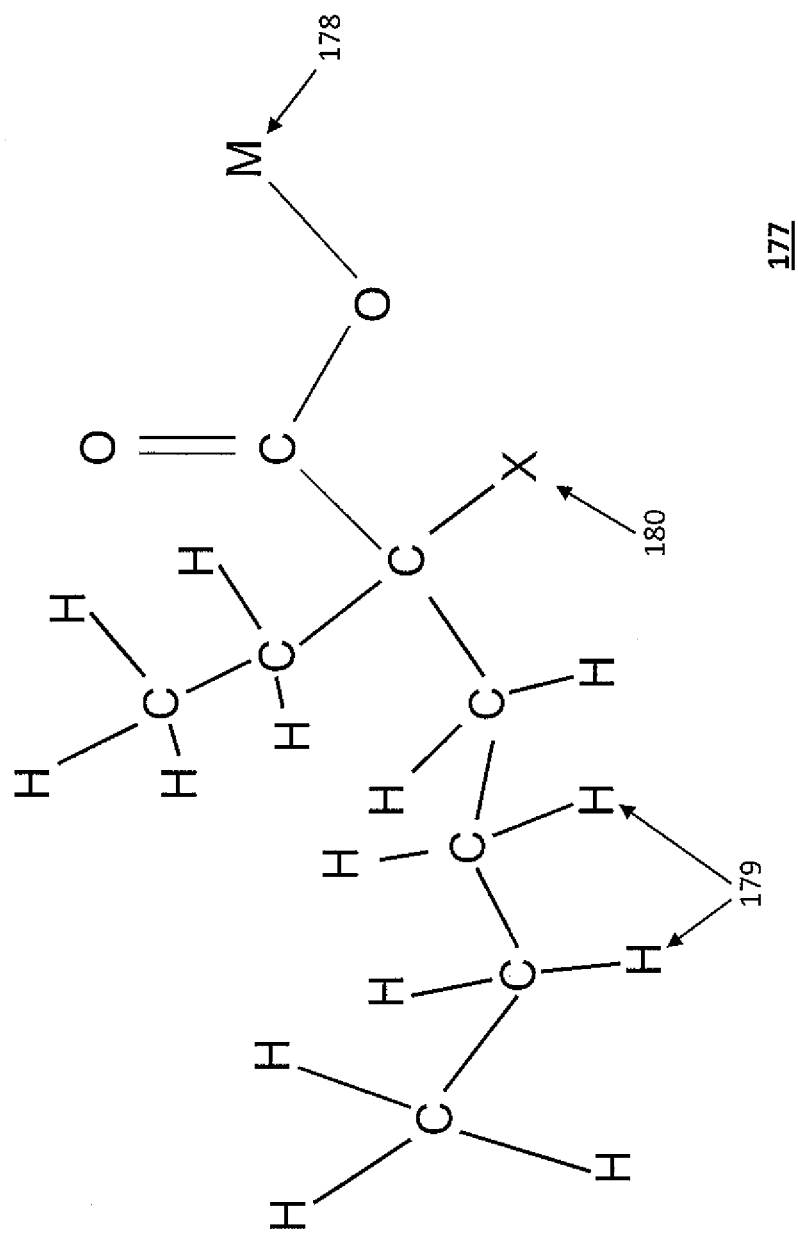
FIG. 8D is a chemical diagram of a metalorganic precursor compound that can be used in association with FIGS. 8A-8C.

Reference is now made to FIGS. 8A,8B,8C,8D to describe how liquid chemical deposition (LCD) methods are used to form the polycrystalline 3D-electron gas semiconductor layers 161. de Rochemont et al, '112, and '159, incorporated herein by way of reference, describes describe the apparatus, and processes used by the LCD process to form an amorphous layer 171 on a substrate 172. The substrate 172 may comprise an appropriately doped semiconductor wafer or a semiconductor layer. The amorphous layer 171 is formed on the substrate 172 by decomposing an aerosol spray of low volatility liquid metalorganic precursors consisting of a stoichiometric mixture of the desired semiconductor compound, its electronic dopants (if desired), and its grain boundary materials in an inert or reducing gas environments. The substrate 172 needs to be heated to a temperature that will pyrolyze liquid precursor compounds having the highest decomposition temperature, typically 200° C. to 500° C., preferably 300° C. to 400° C. The inert or reducing gas atmosphere may comprise nitrogen or noble gases, hydrogen, and/or reducing partial pressure ratios of carbon monoxide and carbon dioxide (by means of applying an aerosol spray of liquid metalorganic precursors to an appropriately doped semiconductor layer or wafer which functions as the substrate 172 (FIG. 8A). The amorphous layer may comprise an elemental semiconductor with electrical and other dopants, or it may be a compound semiconductor with electrical and other dopants. The LCD process enables the amorphous layer to have a precise ratio of chemical components that is compositionally uniform at the atomic scale. Spray deposition is followed by a bake out step that heats the substrate and deposit to temperatures between 400° C. and 600° C. for 2-20 minutes to remove any residual organic material that did not pyrolyze during the aerosol spray deposition step. The presence of any liquid species in the deposit will accelerate the deterioration of atomic scale chemical uniformity during subsequent annealing steps.

A plasma annealing step is then used to render the amorphous layer 171 into a polycrystalline layer 173 that has uniform microstructure with grain sizes 174 ranging between 20-50 nm. Other thermal processing methods may be used to render the amorphous deposit into a polycrystalline state, but rapid thermal annealing process, and plasma annealing processes in particular, are preferred. The substrate 172 and deposit 171 may be pre-heated to temperatures in the range of 40° C. to 400° C. during the ionized plasma annealing step. Argon gas is the primary ballast used in the plasma annealing step, with additional gas additives consisting of nitrogen and/or carbon monoxide and carbon dioxide not exceeding 20% partial pressures. Total atmospheric pressures in the range of 1500 to 5000 mTorr, with power settings ranging from 50 W to 300 W for periods of 5 to 60 seconds are preferred for generating nanoscale polycrystalline semiconducting grains enveloped with a distinct phase grain boundary material.

It is desirable to select metallic species that will be driven towards the grain boundaries by thermodynamic processes during the annealing step to form metallic grain boundaries. In the early-stages of crystalline nucleation, cooperative forces will create crystalline fields that atomically organize the majority elements in the amorphous deposit 171 into its thermodynamically most favored crystalline phase. The cooperative forces will be driven by the majority chemical concentrations, causing chemically compatible elements to be drawn into the crystal nucleation process while expelling chemically incompatible elements to the grain boundaries. For example, if silicon is the majority chemical element, present in the deposit at levels exceeding 99.99 mol %, the crystalline fields that build during the nucleation process will favor the incorporation of elements that have similar charge and molecular orbital orientations, such as germanium. It is therefore desirable to select grain boundary materials from metallic elements that have incompatible charge and orbital characteristics to the semiconductor compound being formed within the grain, such as those shown in Tables I & II. Elements that are located in the columns of The Periodic Table furthest away from the column in which the semiconducting elements are drawn from satisfy this requirement. Therefore, metalorganic precursors to alkali metals or alkaline earth metals, in concentrations of 0.0001 to 0.5 mol %, are added to the liquid precursor solution used to form the amorphous deposit when it is desirable to form metallic grain boundaries 175 in the polycrystalline deposit 173. Alkali metals are preferred over alkaline earth metals. Halogenated metalorganic precursors to alkali metals, alkaline earth metals, or transition metals are added to the liquid precursor solution when it is desirable to form insulating grain boundaries 176 that comprise any of the I-VII grain boundary materials depicted in Tables I and II in the polycrystalline deposit 173. Precursor molecules 177 essentially "carry" a metallic element 178 attached to an organic molecule that decomposes on the surface where the metallic element 178 is eventually deposited. Halogenated precursors will substitute one or more of the hydrogen elements 179 in the organic molecule with a halide element 180 from the group: fluorine, chlorine, iodine, or bromine. Halogenated alkali or alkaline earth metal precursors allows the elemental constituents of insulating compounds, comprising either a singular alkali or alkaline earth halide or a plurality of alkali or alkaline earth halides, to be transported to the deposition surface and integrated into the amorphous deposit and driven into the grain boundary regions 176 in a subsequent plasma annealing step. As explained in greater detail within application '405, silicon carbide or aluminum nitride material phases can be introduced to the amorphous deposit 171 by forming a colloidal suspension of liquid metalorganic precursors and silicon carbide or aluminum nitride nanoparticles. These nanoparticle carbide and nitride phases will migrate to the grain boundaries during plasma annealing when their molar concentrations are held between 0.0001 mol % and 0.75 mol %.

A specific advantage to the present invention is its ability to use the 3D electron gases generated by the nanoscale polycrystalline semiconductors to increase the carrier mobility within a specific layer or in a plurality of layers, which is not possible under the prior art. In the prior art described by Phillips '292, a 2D electron gas is generated by forming quantum wells by sandwiching a layer of low band gap semiconductor, such as indium antimonide (InSb, $E_{gap}$=0.17 eV), between epitaxial layers of higher band gap semiconductors. (See FIGS. 1&2). Low band gap semiconductors such as InSb can have very high charge carrier mobility, as shown in FIG. 4, but they are also susceptible to avalanche currents due to impact ionization processes that cause conduction band electrons accelerated by electrical drift to knock valence band electrons off of the atoms to which they are bound. This process generates excess conduction band electrons that generate runaway switching currents which compromise performance. The 2D quantum wells create a quantized energy band structure within the planar low band gap semiconductor that effectively shields the valence band electrons from the conduction electrons travelling through the layer at ballistic velocities. Additional layers 3,4 of wider band gap semiconductor 24,25 can be added to further mitigate impact ionization processes. The 2D quantum wells shield valence band electrons and minimize electromagnetic interactions between the free electrons and the valence band electrons bound to the atoms forming the semiconductor material. The shielding reduces the conduction electron's effective mass, ("inertia"), which makes it more responsive to drift transport mechanisms under the influence of an applied electric field.

As mentioned above, tunneling processes represent the fastest electron transport mechanism. Tunneling processes are possible between adjacent quantum wells (not shown), but not within a low band gap semiconductor layer since there are no energy barriers within layer forming the bottom of the well. (Adjacent quantum wells can be visualized by imagining a plurality of multilayer structures in the vertical direction of FIG. 1.) The principal benefits to a planar 2D electron gas is a lowered electron (and hole) effective mass and reduced susceptibility to impact ionization within a very thin (20-50 nm) layer of a low-band gap semiconductor layer.

As mentioned above, the 3D quantum wells of the present invention interject an energy barrier at the boundary of every grain. Therefore, the mean free path of any conduction electron is limited to the nanoscale dimension of the grain (20 nm to 50 nm). The drifting electron will then encounter a thin (2 nm to 10 nm) energy barrier through which it will tunnel. The combination of reduced mean free path (reduced impact ionization) and tunneling currents in the direction or primary drift currents allows all types of semiconductor materials to support fast transport processes in any direction, without the restriction of limiting the modulated current to a 20-50 nm layer.

Figure 9:
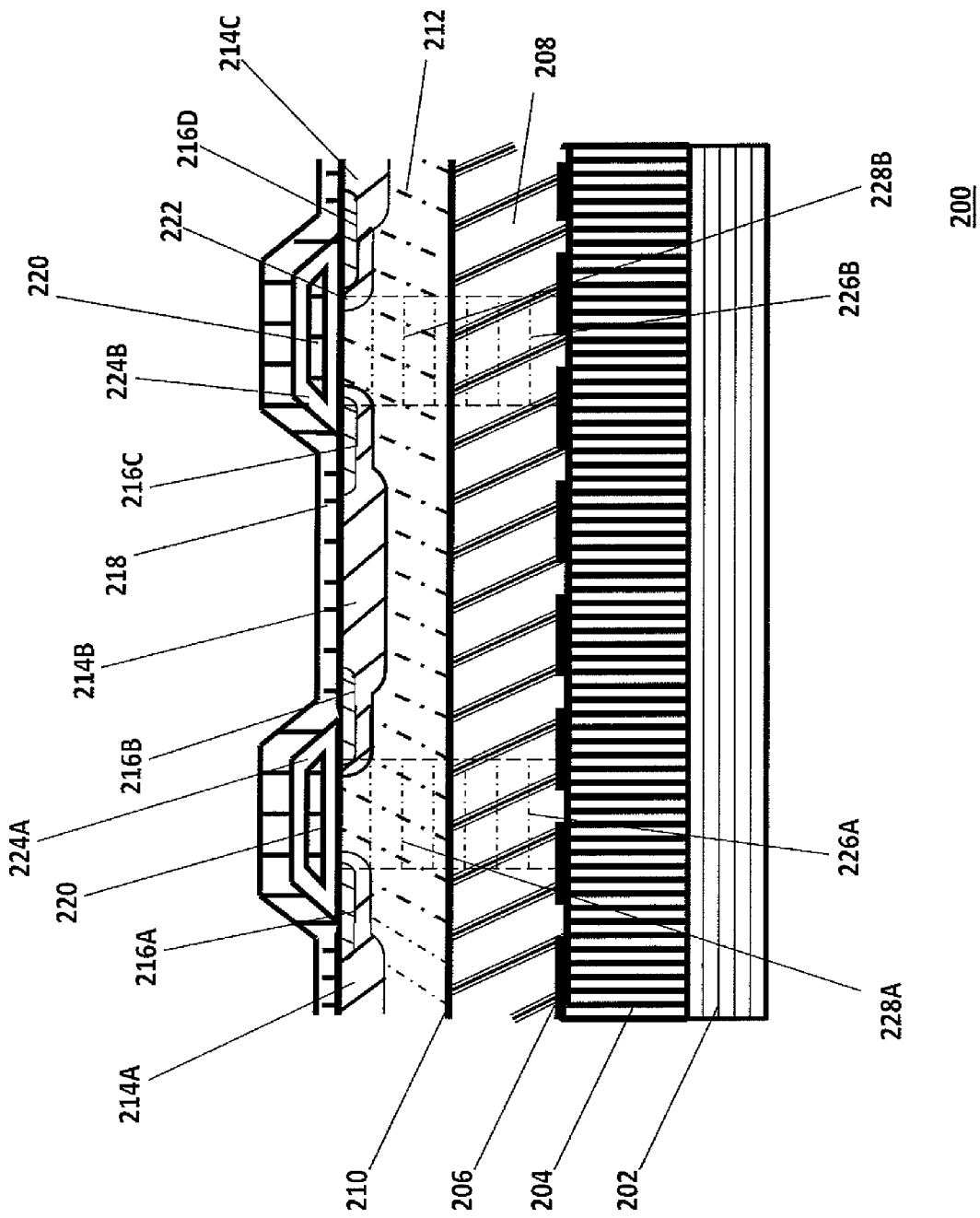
FIG. 9 depicts an IGBT power FET that contains a nanoscale polycrystalline 3D electron gas layer.

This advantage is particularly important in power FET devices, opto-electronic or photonic devices as any of the layers 161,162,163,164 (see FIG. 7) may be formed as an arbitrarily thick semiconducting 3D electron gas. Additionally, each individual layer 161,162,163,164 may be composed of semiconducting grains having an energy band gap that is distinct from the band gap in a neighboring polycrystalline semiconducting layer. This aspect of the invention is particularly beneficial to device structures where switching speeds are limited by reduced carrier mobility in bulk semiconducting layers by virtue of the layer's electronic doping, as is the case with the insulated gate bipolar transistor (IGBT) where the $p^+$-doping layer will limit switching speeds. FIG. 9 depicts a cross-sectional view of an IGBT device 200 integrated on the silicon chip carrier, which may optionally include the semiconductor carrier substrate 202 and electrode 204 that functions as a ground and a heat sink. LCD enables the insertion of a very thin amorphous layer 206 that allows a single crystal $p^+$-type semiconductor drain layer comprising a semiconducting 3D electron gas layer 208 to be deposited upon the drain electrode 204, which may also comprise a 3D electron gas layer. A p-n junction 210 forms between the $p^+$-type semiconductor drain layer 208 and an $n^-$-type semiconductor layer 212 that may optionally consist of 3D electron gas polycrystalline material. The $n^-$-type semiconductor layer is electrically patterned with p-type subchannel 214A, 214B,214C and n+-type dopant profiles 216A,216B,216C, 216D that are in electrical communication with the source electrode 218. The insulated gate electrode 220 modulates inversion carrier populations in a channel 222 that allow currents to flow from the drain 208 to the source electrode 218. The gate electrode 220 is encapsulated within a low loss high-dielectric breakdown insulating material 224A,224B, preferably an amorphous silica insulating material. Any or all of the semiconductor layers may consist of a nanoscale engineered polycrystalline semiconductor modified to generate a 3D electron gas. Since LCD deposition methods also enable three dimensional monolithic materials integration, vertical conduction channels consisting of 3D electron gas semiconductor regions 226A,226B,228A,228B that may be optionally added to the device structure, wherein each of the 3D electron gas semiconductor regions 226A,226B,228A,228B may comprise polycrystalline grains having energy band gaps that differ from the energy band gaps in any of the adjacent semiconductor material in the IGBT device 200, thus forming a plurality of heterostructures within the three-dimensionally patterned monolithic structure.

Figure 10:
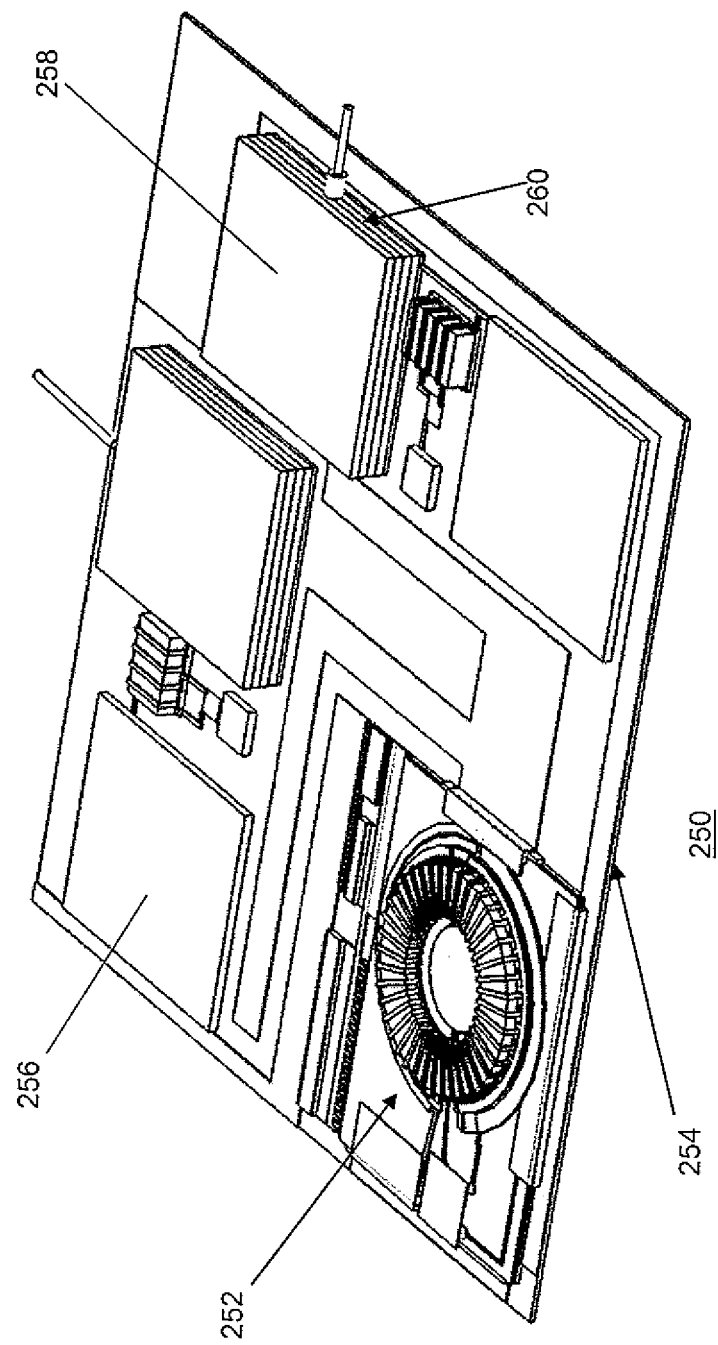
FIG. 10 depicts a semiconductor carrier comprising a quantum-dot opto-electronic or photonic device monolithically integrated onto its surface.

A final embodiment is depicted in FIG. 10, which depicts a semiconducting carrier 250 that consists of a power management module 252 monolithically integrated upon the surface of the carrier substrate 254, one or more semiconductor die 256 mounted thereupon, and an opto-electronic or photonic device 258 that contains a 3D electron gas semiconducting layer 260 embedded within it.

It is readily understood that the quantum well technology and manufacturing methods described herein may be easily applied to any other form of quantum well devices, including but not limited to multiplexers, signal encoders, and sensors. It is further readily understood that the devices described above embody methods of manufacture and methods of operation which are also new and non-obvious with respect to the prior art.

The present invention is illustratively described above in reference to the disclosed embodiments. Various modifications and changes may be made to the disclosed embodiments by persons skilled in the art without departing from the scope of the present invention as defined in the appended claims.

What is claimed is:

1. A three-dimensional polycrystalline semiconductor material that forms a free electron gas characteristic of quantum wells, comprising a uniform three-dimensional assembly of granular quantum wells, with each granular quantum well further comprising:
a semiconducting major ingredient forming individual crystalline grains having the same nominal maximum grain diameter between 20 nm and 50 nm and atomic-scale chemical uniformity throughout the interior of the granular quantum well; and
a minor ingredient enveloping the major ingredient within the granular quantum wells and forming energetic grain boundaries between the semiconducting major ingredients within adjacent crystalline grains;
wherein the assembly of three-dimensional granular quantum wells forming the polycrystalline semiconductor material has a uniform nanoscale microstructure and grain size; and
further wherein the free electron gas formed by polycrystalline semiconductor material extends to distances greater than the grain diameter in every direction.

2. The material of claim 1, wherein the molar concentrations of the minor ingredient are between 0.0001 mol % and 0.75 mol % of the polycrystalline material.

3. The material of claim 1, wherein the major ingredient comprising the crystalline grains is silicon, germanium, tin, or any admixture thereof.

4. The material of claim 3, wherein the minor ingredient forming the grain boundaries is an insulating, semi-insulating, or semiconducting material consisting of a metal halide comprising an alkali element from the first (I) column or an alkaline earth element from second (II) column of the periodic table, or a transition-metal having chemical properties similar to an alkali or alkaline earth metal, and a halogen element selected from the seventh (VII) column of the periodic table.

5. The material of claim 4, wherein the insulating or semi-insulating material has an energy band gap that is larger than the band gap of the semiconductor material comprising the polycrystalline grain.

6. The material of claim 1, wherein the major ingredient comprising crystalline grains is a III-V compound semiconducting material and the minor ingredient forming the boundaries is an insulating, semi-insulating, or semiconducting material consisting of a metal halide comprising an alkali element from the first (I) column or a transition-metal having chemical properties similar to an alkali metal, and a halogen element selected from the seventh (VII) column of the periodic table.

7. The material of claim 1, wherein the major ingredient of the crystalline grains is a II-VI compound semiconductor and the minor ingredient forming the boundaries is silicon, silicon carbide, germanium, tin or an admixture thereof.

8. The material of claim 1, wherein the free electron gas formed by polycrystalline semiconductor material extends to distances greater than 50 nm in every direction.

9. The material of claim 1, wherein the polycrystalline material is monolithically integrated into an active device.

10. The material of claim 9, wherein the active device is a field effect transistor, an opto-electronic device or a photonic device.

11. The material of claim 4, wherein the minor ingredient is semi-insulating or semiconducting material.

12. A semiconductor carrier, comprising an active device including a polycrystalline semiconductor layer that is monolithically integrated into the semiconductor carrier, wherein the polycrystalline semiconductor layer is comprised of an assembly of granular quantum wells further comprising grains of a semiconducting major ingredient having atomic-scale chemical uniformity, nominally equal size, and maximal physical dimensions in the range of 20 nm to 50 nm that are enveloped by a grain boundary material of a minor ingredient that forms an energy barrier and is 2 nm to 10 nm thick, such that the quantum size effects within the granular quantum wells induce a free electron gas characteristic of a quantum well across all spatial directions of the assembly of granular quantum wells.

13. The semiconductor carrier of claim 12, wherein the active device is field effect transistor, an opto-electronic device or a photonic device.

14. The semiconductor carrier of claim 12, wherein the active device comprises a power management module having passive network circuitry monolithically integrated on to its surface.

15. The semiconductor carrier of claim 12, wherein the active device comprises a semiconductor die mounted on the carrier surface.

16. The semiconductor carrier of claim 12, wherein the semiconductor carrier comprises a semiconducting substrate that has active circuitry integrated within and passive network circuitry monolithically integrated upon the carrier substrate.

* * * * *